(12) United States Patent
Eitan et al.

(10) Patent No.: US 12,506,109 B2
(45) Date of Patent: Dec. 23, 2025

(54) DIE BONDING TOOL WITH TILTABLE BOND HEAD FOR IMPROVED BONDING AND METHODS FOR PERFORMING THE SAME

(71) Applicant: Taiwan Semiconductor Manufacturing Company Limited, Hsinchu (TW)

(72) Inventors: Amram Eitan, Hsinchu (TW); Hui-Ting Lin, Tainan (TW); Chien-Hung Chen, Hsinchu (TW); Chih-Yuan Chiu, Zhudong Township (TW); Kai Jun Zhan, Taoyuan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 397 days.

(21) Appl. No.: 18/188,621

(22) Filed: Mar. 23, 2023

(65) Prior Publication Data
US 2024/0194633 A1    Jun. 13, 2024

Related U.S. Application Data

(60) Provisional application No. 63/431,319, filed on Dec. 9, 2022.

(51) Int. Cl.
*H01L 23/00* (2006.01)

(52) U.S. Cl.
CPC .............. *H01L 24/75* (2013.01); *H01L 24/81* (2013.01); *H01L 2224/75318* (2013.01); *H01L 2224/7592* (2013.01); *H01L 2224/75983* (2013.01); *H01L 2224/80203* (2013.01); *H01L 2224/80895* (2013.01); *H01L 2224/80908* (2013.01); *H01L 2224/81203* (2013.01); *H01L 2224/81908* (2013.01)

(58) Field of Classification Search
CPC .................... H01L 24/75; H01L 24/81; H01L 2224/75318
See application file for complete search history.

(56) References Cited

U.S. PATENT DOCUMENTS 10,872,875 B2 * 12/2020 Lee .................... H01L 24/75
11,837,573 B2 * 12/2023 Kim .................... H01L 24/83

* cited by examiner

*Primary Examiner* — Dale E Page
*Assistant Examiner* — Wilner Jean Baptiste
(74) *Attorney, Agent, or Firm* — The Marbury Law Group, PLLC

(57) ABSTRACT

A die bonding tool includes a bond head that secures a semiconductor die against a planar surface of the bond head, an actuator system that moves the bond head and the semiconductor die towards a surface of a target substrate, and at least one contact sensor configured to detect an initial contact between a first region of the semiconductor die and the surface of the target substrate, where in response to detecting the initial contact between the semiconductor die and the target substrate, the actuator tilts the planar surface of the bond head and the semiconductor die to bring a second region of the semiconductor die into contact with the surface of the target substrate and thereby provide improved contact between the semiconductor die and the target substrate and more effective bonding including instances where the planar surface of the bond head and the target substrate surface are not parallel.

20 Claims, 15 Drawing Sheets

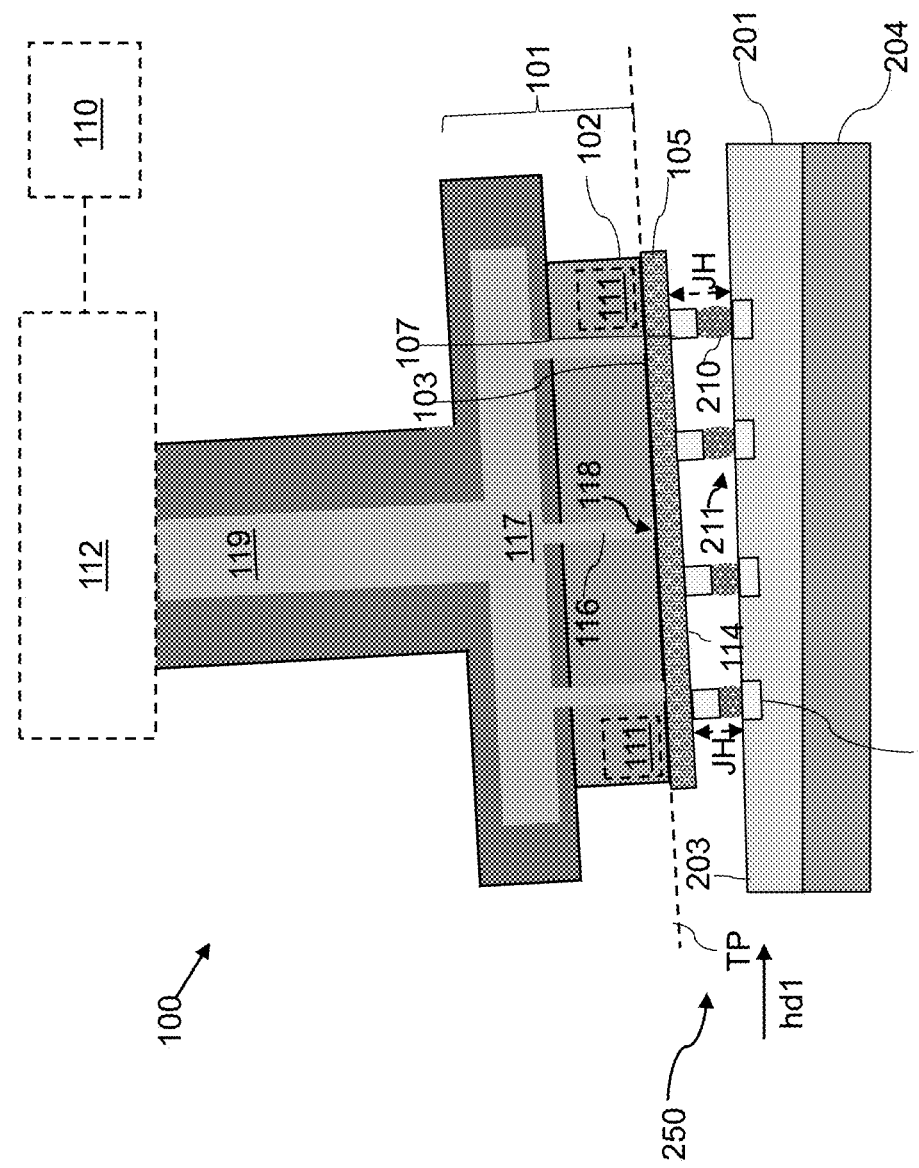

DIE BONDING TOOL WITH TILTABLE BOND HEAD FOR IMPROVED BONDING AND METHODS FOR PERFORMING THE SAME

RELATED APPLICATIONS

This application claims the benefit of priority from a U.S. provisional application Ser. No. 63/431,319, titled "Bond Head with Self-tilt Adjust Concept for Well-fit Contact Surface," filed on Dec. 9, 2022, the entire contents of which are incorporated herein by reference.

BACKGROUND

The semiconductor industry has grown due to continuous improvements in integration density of various electronic components (e.g., transistors, diodes, resistors, capacitors, etc.). For the most part, these improvements in integration density have come from successive reductions in minimum feature size, which allows more components to be integrated into a given area.

In addition to smaller electronic components, improvements to the packaging of components have been developed in an effort to provide smaller packages that occupy less area than previous packages. Example approaches include quad flat pack (QFP), pin grid array (PGA), ball grid array (BGA), flip chips (FC), three-dimensional integrated circuits (3DICs), wafer level packages (WLPs), package on package (PoP), System on Chip (SoC) or integrated SoC devices. Some of these three-dimensional devices (e.g., 3DIC, SoC, integrated SoC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2E is a vertical cross-section view of the die bonding tool following a bonding process that bonds the semiconductor IC die to the target substrate to form a bonded device structure according to various embodiments of the present disclosure.

DETAILED DESCRIPTION

Figure 1A:
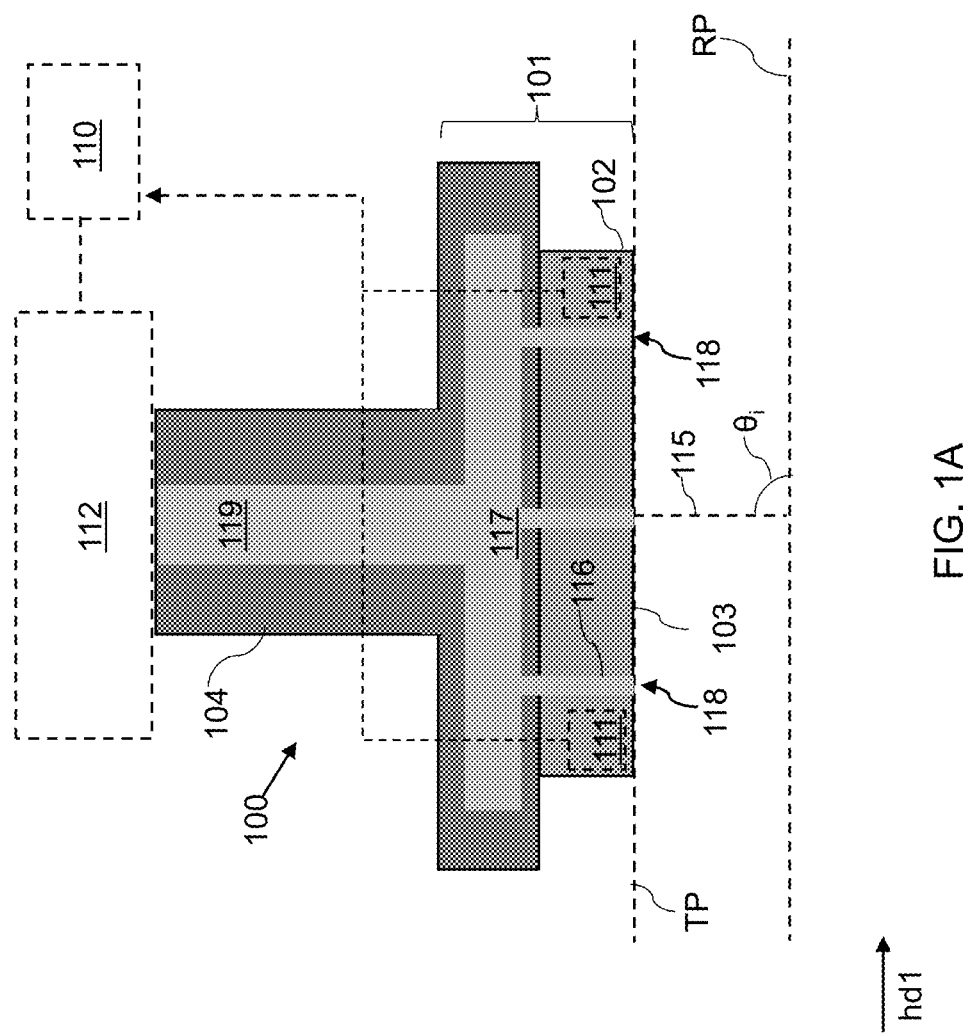
FIG. 1A is a vertical cross-sectional view of a die bonding tool according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

In various embodiments, a die bonding tool may be used to bond a semiconductor integrated circuit (IC) die (which may also be referred to as a "chip") to a target substrate, such as a semiconductor wafer. The die bonding tool may include a bond head that is configured to temporarily adhere a semiconductor IC die to the bond head, such as via a vacuum suction force. The die bonding tool may align the semiconductor IC die over a bonding region of the target substrate and bring bonding structures, such as metal bonding pads, metal pillars, and/or solder material portions, on the lower surface of the semiconductor IC die into contact with corresponding bonding structures on the upper surface of the target substrate. The bond head may then be used to apply a compressive force to the semiconductor IC die to bond the semiconductor IC die to the bonding region of the target substrate.

To form an effective bond between the semiconductor IC die and the target substrate, it is desirable to form good contact between the bonding structures on the semiconductor IC die and the corresponding bonding structures on the target substrate. For larger semiconductor package sizes with a small pitch between adjacent bonding structures, the process window for providing an effective bond between the semiconductor IC die and the target substrate becomes increasingly sensitive to variations in the thickness and/or surface planarity of the target substrate and the semiconductor IC die. In embodiments in which the interfacing bonding surfaces on the target substrate and/or the semiconductor IC die are not perfectly parallel to the surface of the bond head to which the semiconductor IC die is affixed, there may be differences in the vertical height of the bonds that occur between the semiconductor IC die and the target substrate across different regions of the semiconductor IC die. A large variation in joint heights may result in poor or defective bonding between the semiconductor IC die and the target substrate, which may negatively impact device performance and yields.

In order to improve the bonding between a semiconductor IC die and a target substrate, various embodiments of the present disclosure are directed to a die bonding tool that includes a bond head having a planar surface to which the semiconductor IC die may be secured that is tiltable about at least one tilt axis. In various embodiments, an actuator system may move the bond head and the semiconductor die towards a surface of a target substrate, and at least one contact sensor of the die bonding tool may detect an initial contact between a first region of the semiconductor die and the surface of the target substrate. In response to detecting the initial contact between the first region of the semiconductor die and the target substrate, the actuator may be configured to tilt the planar surface of the bond head and the semiconductor die to bring a second region of the semiconductor die into contact with the surface of the target substrate. Accordingly, improved contact may be achieved between the semiconductor die and the target substrate in instances in which at least one of the interfacing surfaces between the semiconductor IC die and the target substrate are not parallel to the planar surface of the bond head. This may result in more effective bonding with reduced joint height variation in the bonds formed between the semiconductor IC die and the target substrate.

FIG. 1A is a vertical cross-sectional view of a die bonding tool 100 according to various embodiments of the present disclosure. The die bonding tool 100 may include a bond head 101, an actuator system 112 configured to move the bond head 101, and a connecting member 104 extending between the actuator system 112 and the bond head 101. The bond head 101 may include a nozzle plate 102 having a substantially flat lower surface 103. The nozzle plate 102 of the bond head 101 may also include one or more openings 118 (i.e., ports) in the lower surface 103 of the nozzle plate 102. In some embodiments, one or more fluid conduits 116 in the bond head 101 may extend between each opening 118 in the lower surface 103 of the nozzle plate 102 and an internal plenum 117 of the bond head 101. A fluid conduit 119 may extend through the connecting member 104 to couple the internal plenum 117 of the bond head 101 to a vacuum source (not shown in FIG. 1A). The vacuum source may selectively apply a negative pressure within the fluid conduit 119, the plenum 117 and the fluid conduit(s) 116 such that a vacuum or suction force may be generated at each of the openings 118 in the nozzle plate 102. The suction force may be sufficient to secure a semiconductor IC die against the lower surface 103 of the nozzle plate 102.

The die bonding tool 100 may include a system controller 110, which may be central processing unit (CPU), that may be operatively coupled to the actuator system 112. The system controller 110 may be configured to send control signals to the actuator system 112 to cause actuator system 112 to move the bond head 101 and connecting member 104. In various embodiments, the actuator system 112 may be configured to translate the bond head 101 and connecting member 104 along horizontal and/or vertical directions, as well as to tilt the bond head 101 as described in further detail below. In some embodiments, the system controller 110 may also control the operation of the vacuum source to selectively provide a suction force at each of the openings 118 in the nozzle plate 102.

Figure 1B:
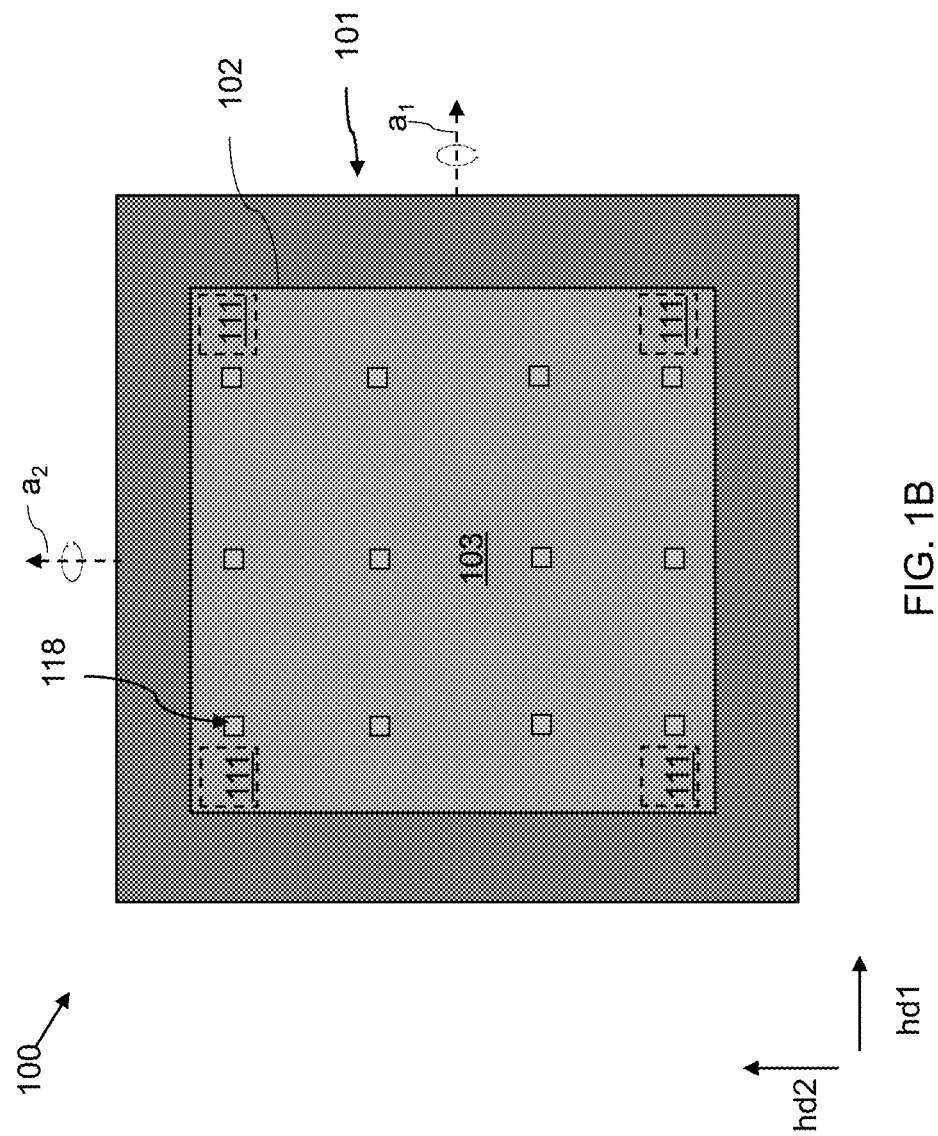
FIG. 1B is a bottom view of the bond head of the die bonding tool of FIG. 1A illustrating a plurality of contact sensors according to various embodiments of the present disclosure.

Referring again to FIG. 1A, the die bonding tool 100 may further include one or more contact sensors 111. Each of the contact sensors 111 may be operatively coupled to the system controller 110 as schematically indicated by dashed lines in FIG. 1A. Each of the contact sensors 111 may be configured to detect contact between the bond head 101 and/or a semiconductor IC die attached thereto, and another object, such as a target substrate to which the semiconductor IC die is to be bonded. FIG. 1B is a bottom view of the bond head 101 of FIG. 1A illustrating a plurality of contact sensors 111. Although FIGS. 1A and 1B illustrate the contact sensors 111 located on the nozzle plate 102 of the bond head 101, it will be understood that in other embodiments, one or more contact sensors 111 may located in another location on the die bonding tool 100, such as in a different location on the bond head 101 and/or on the connecting member 104.

In various embodiments, the one or more contact sensors 111 may be configured to detect contact with the bond head 101 and/or the semiconductor IC die in different regions of the bond head 101 and/or the semiconductor IC die. In the embodiment shown in FIG. 1B, four contact sensors 111 are configured to detect contact at respective corner regions of a quadrilateral-shaped bond head 101 and/or semiconductor IC die. It will be understood that other embodiments may include a greater or lesser number of contact sensors 111 for detecting contact in different regions of the bond head 101 and/or the semiconductor IC die. Further, although FIGS. 1A and 1B illustrate a bond head 101 having a quadrilateral shape, it will be understood that the bond head 101 may have a different shape, such as a circular or oval shape, and may include contact sensors 111 for detecting contact in different regions, such as around the outer periphery of the bond head 101.

In some embodiments, at least one contact sensor 111 may include a plurality of force sensors located in different regions of the bond head 101. The force sensors may be configured to detect a force applied to the bond head 101 and/or the semiconductor IC die attached thereto indicating that a particular region of the bond head 101 and/or the semiconductor IC die has contacted another object, such as a target substrate. Suitable examples of force sensors may include, without limitation, strain gauges, load cells, force sensing resistors, and the like. Other suitable force sensors are within the contemplated scope of disclosure. Alternatively, or in addition, the at least one contact sensor 111 may include other types of feedback sensors, such as one or more encoders that are configured to determine the relative position and/or motion of different regions of the bond head 101, where a change in the relative position and/or motion of a particular region of the bond head 101 may indicate that the region of the bond head 101 and/or the semiconductor IC die has contacted another object, such as a target substrate. Other suitable contact sensors 111 are within the contemplated scope of disclosure.

Referring again to FIG. 1A, in various embodiments, the lower surface 103 of the nozzle plate 102 of the bond head 101 may have an initial orientation with respect to a reference plane RP. In the embodiment shown in FIG. 1A, the reference plane RP is a horizontal plane that is parallel to a first horizontal direction hd1, although it will be understood that the reference plane RP may not be a horizontal plane. The flat lower surface 103 of the nozzle plate 102 may define a tool plane TP that may have an initial orientation with respect to the reference plane RP. In the embodiment of FIG. 1A, the tool plane TP defined by the lower surface 103 of the nozzle plate 102 is parallel to the reference plane RP such that a line 115 normal to the lower surface 103 of the nozzle plate 102 is perpendicular to the reference plane RP—i.e., the angle θ; between line 115 and the reference plane RP is 90°. It will be understood in other embodiments, the initial orientation of the bond head 101 may define a tool plane TP that is not parallel to the reference plane RP (i.e., $θ_i \neq 90°$).

Figure 1C:
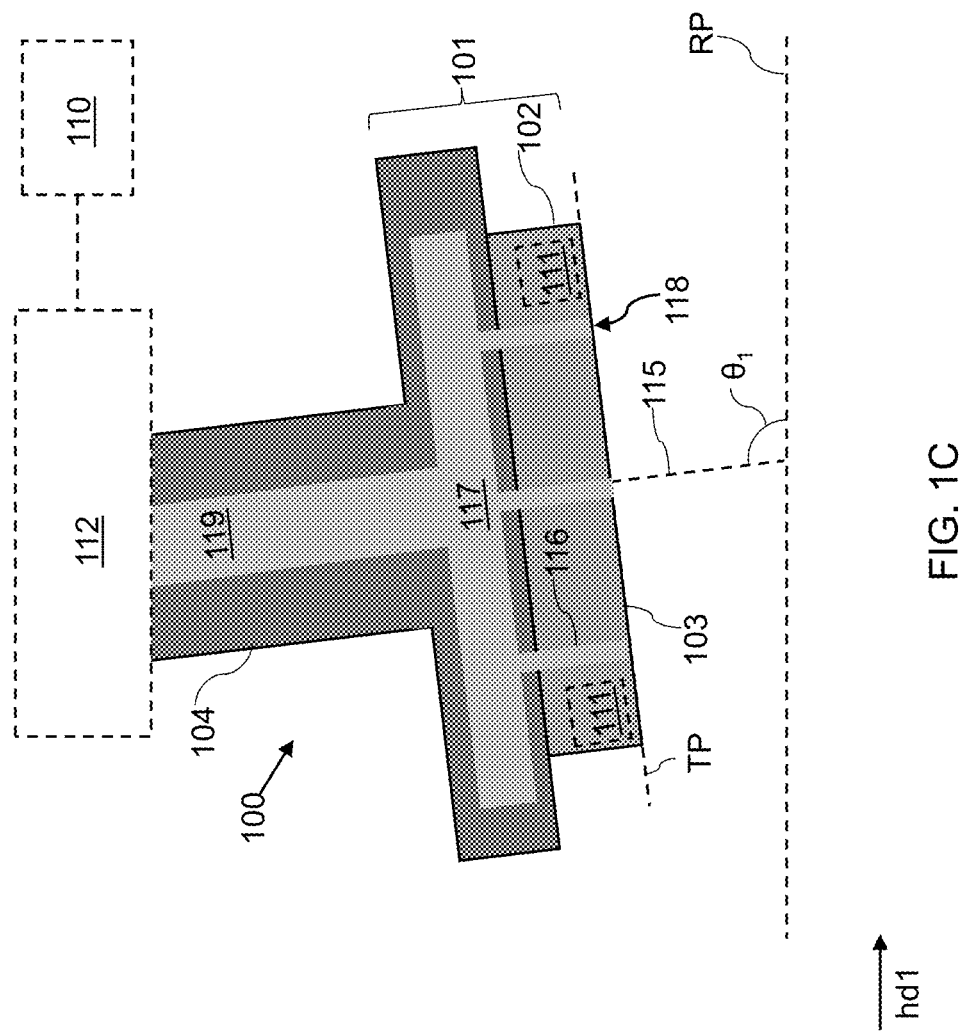
FIGS. 1C and 1D are vertical cross-sectional views of the die bonding tool of FIG. 1A illustrating a tilt motion of the bond head according to various embodiments of the present disclosure.
Figure 1D:
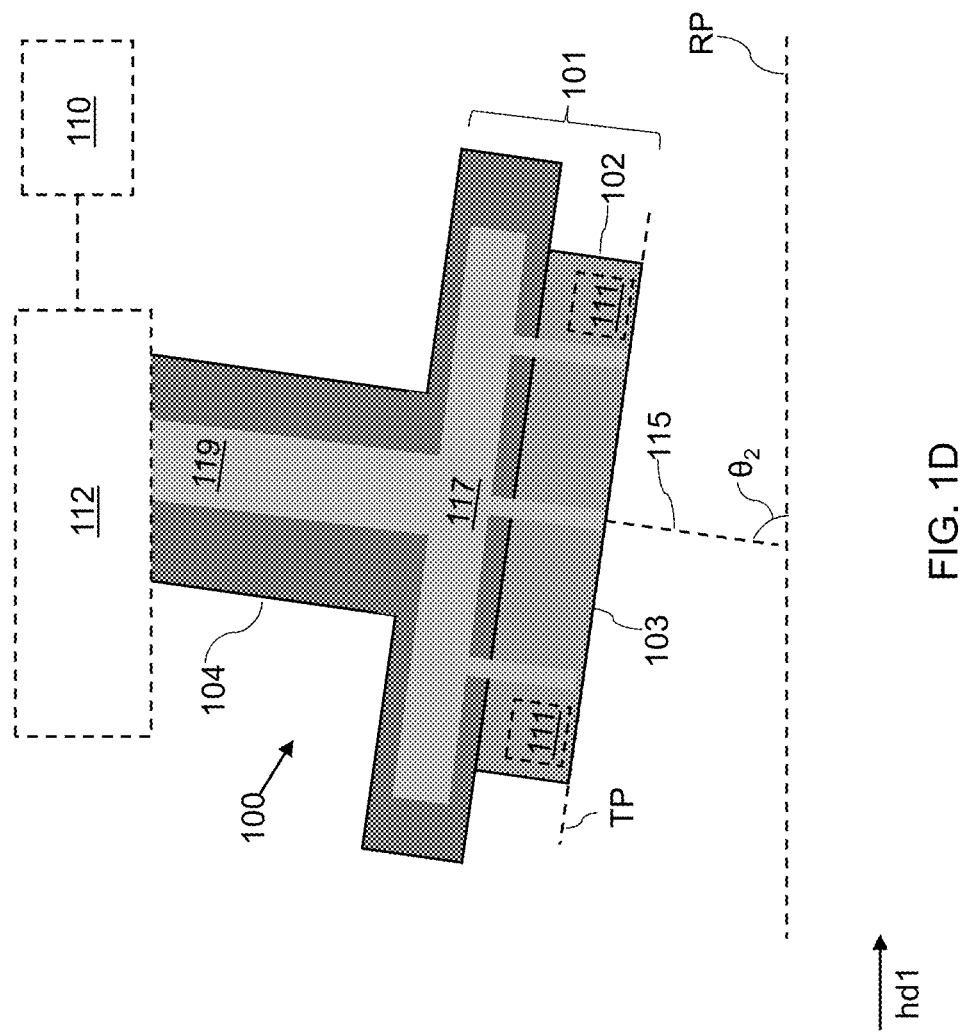

Referring to FIGS. 1A and 1B, in various embodiments the bond head 101 may be tiltable about two mutually perpendicular axes, $a_1$ and $a_2$. In the embodiment shown in FIG. 1B, the first axis $a_1$ is parallel to the first horizontal direction hd1, and the second axis $a_2$ is parallel to a second horizontal direction hd2 that is perpendicular to the first horizontal direction hd1. In various embodiments, the tilt motion of the bond head 101 may change the orientation of the tool plane TP defined by the lower surface 103 of the nozzle plate 102 with respect to the reference plane RP. This is illustrated in FIGS. 1C and 1D, which are vertical cross-section views illustrating the tilt motion of the bond head 101 with respect to the reference plane RP. In FIG. 1C, the bond head 101 is tilted in a first direction with respect to the reference plane RP, and in FIG. 1D the bond head 101 is tilted in a second direction with respect to the reference plane RP. In both FIGS. 1C and 1D, the tool plane TP is not parallel to the reference plane RP, and the angles $θ_1$ and $θ_2$ between line 115 and the reference plane RP are not 90°. In some embodiments, the tilt motion of the bond head 101 may enable the peripheral edges of the bond head 101 to be vertically displaced by at least about ±50 μm, such as about ±100 μm, including about ±150 μm, or more, as compared to the initial orientation of the bond head 101.

The actuator system 112 of the die bonding tool 100 may be configured to provide the tilt motion of the bond head 101 as shown in FIGS. 1C and 1D. In some embodiments, the actuator system 112 may be a motorized system including one or more motors, linear and/or rotary actuators, sliders, cams, joints, linkages, and/or feedback sensors (e.g., encoders), etc., that may be configured to controllably tilt the lower surface 103 of the nozzle plate 102 of the bond head 101 about at least a first rotation axis $a_1$, and in some embodiments, about both the first rotation axis $a_1$ and a second rotation axis $a_2$ that is perpendicular to the first rotation axis $a_1$. Although the actuator system 112 in the embodiment of FIGS. 1A-1D is shown coupled to the end of the connecting member 104 that is opposite to the bond head 101, it will be understood that the actuator system 112 may be located in other locations on the die bonding tool 100, such as between the connecting member 104 and the bond head 101, or within the bond head 101 such that a lower portion of the bond head 101 including the nozzle plate 102 may be tiltable with respect to an upper portion of the bond head 101.

Figure 2A:
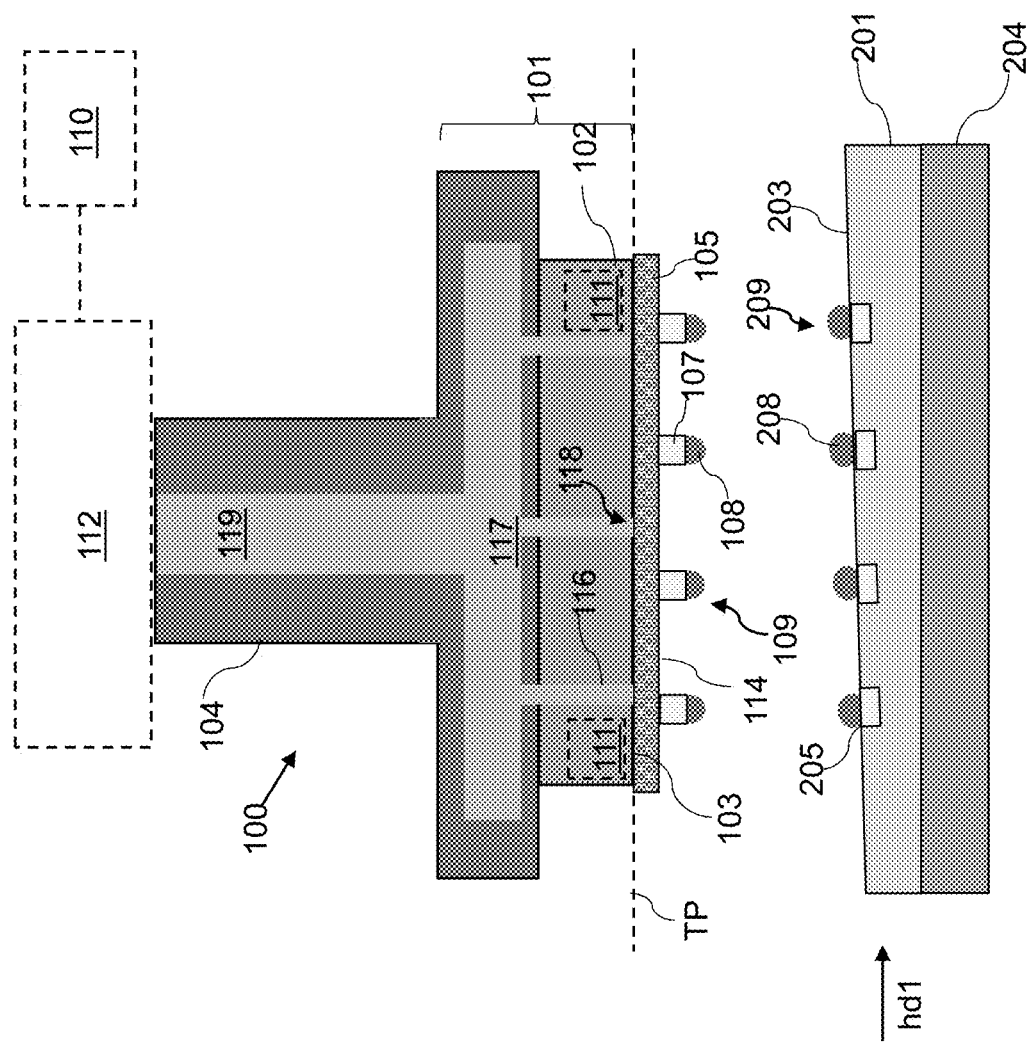
FIG. 2A is a vertical cross-section view of a die bonding tool illustrating a semiconductor integrated circuit (IC) die attached to a bond head of the die bonding tool and aligned over a target substrate according to various embodiments of the present disclosure.

FIGS. 2A-2E are sequential vertical cross-section views illustrating a process of bonding a semiconductor IC die 105 to a target substrate 201 using a die bonding tool 100 according to various embodiments of the present disclosure. Referring to FIG. 2A, a semiconductor IC die 105 may be secured against the lower surface 103 of the nozzle plate 102 of the bond head 101 via a suction force applied at the one or more openings 118 in the lower surface 103 of the nozzle plate 102. The semiconductor IC die 105 may include a semiconductor material, such as silicon, having a number of circuit components and elements formed on and/or within the semiconductor material. Semiconductor IC dies 105 are typically fabricated by sequentially depositing insulating or dielectric layers, conductive layers, and semiconductive layers of material over a semiconductor substrate, patterning the various material layers using lithography to form integrated circuits, and separating individual dies from the wafer such as by sawing between the integrated circuits along scribe lines. In some embodiments, the semiconductor IC die 105 may be a system-on-chip (SoC) die. An SoC die may include, for example, an application processor die, a central processing unit die, and/or a graphic processing unit die. In some embodiments, the semiconductor IC die 105 may be a memory die. A memory die may include, for example, a dynamic random access memory (DRAM) die, and/or a high bandwidth memory (HBM) die. Other suitable semiconductor IC dies 105, such as an application-specific integrated circuit (ASIC) die, an analog die, a sensor die, a wireless and radio frequency die, a voltage regulator die, and the like, are within the contemplated scope of disclosure.

The semiconductor IC die 105 may have a plurality of die-side bonding structures 109 located over the lower surface 114 of the semiconductor IC die 105 opposite to the bond head 101. In the embodiment shown in FIGS. 2A-2E, the die-side bonding structures 109 include a plurality of metal pillars 107 on the lower surface 114 of the semiconductor IC die 105 and solder material portions 108 (e.g., solder balls) on each of the metal pillars 107. Accordingly, the semiconductor IC die 105 in this embodiment may be bonded to the target substrate 201 using a solder-based bonding method. In some embodiments, the metal pillars 107 may include copper or a copper alloy. Other suitable conductive materials for the metal pillars 107, including nickel, platinum, palladium, gold, aluminum, etc., including combinations and alloys thereof, may be utilized. The metal pillars 107 may be formed using any number of suitable techniques, including physical vapor deposition (PVD), chemical vapor deposition (CVD), electrochemical deposition (ECD), molecular beam epitaxy (MBE), atomic layer deposition (ALD), electroplating, etc. Each of the metal pillars 107 may contact a conductive bonding pad and/or an under bump metallization (UBM) (not shown in FIGS. 2A-2E) on the lower surface 114 of the semiconductor IC die 105. In some embodiments, an optional conductive cap layer (not shown) may be formed between the metal pillar 107 and the solder material portion 108. For example, in an embodiment in which the metal pillar 107 may be formed of copper, a conductive cap layer formed of nickel may be used. Other materials, such as platinum, gold, silver, combinations thereof, etc., may also be used. The solder material portions 108 may be formed over the ends of the respective metal pillars 107 and/or on the optional conductive cap layers. In some embodiments, the solder material portion 108 may directly formed on the bonding pads/UBM on the lower surface 114 of the semiconductor IC die 105, for example, in embodiments where metal pillars 107 and cap layers may not be included. The solder material portions 108 may include SnPb, a high-Pb material, a Sn-based solder, a lead-free solder, or other suitable conductive materials, as examples. In some embodiments, a center-to-center spacing (i.e., pitch) between the die-side bonding structures 109 on the lower surface 114 of the semiconductor IC die 105 utilizing a solder-based bonding method may about 150 μm or less.

Referring again to FIG. 2A, the actuator system 112 may move the bond head 101 along one or more horizontal directions to align the semiconductor IC die 105 over a portion of a target substrate 201 to which the semiconductor IC die 105 is to be bonded. The target substrate 201 may be located on a lower support member 204, such as a wafer chuck. In some embodiments, the target substrate 201 may be a semiconductor material substrate (i.e., a semiconductor wafer). The semiconductor material substrate may have one or more integrated circuits formed on or in the substrate 201. Other suitable target substrates 201, such as glass, ceramic and/or organic material substrates, are within the contemplated scope of disclosure.

The target substrate 201 may have a plurality of substrate-side bonding structures 209 located over the upper surface 203 of the target substrate 201. The substrate-side bonding structures 209 may include bonding pads 205 and solder material portions 208 (e.g., solder balls) on each of the bonding pads 205. The arrangement and spacing (i.e., pitch) of the substrate-side bonding structures 209 may be the same as the arrangement and spacing of the die-side bonding structures 109 located on the lower surface of the semiconductor IC die 105. In some embodiments, either the solder material portions 208 of the substrate-side bonding structures 209 or the solder material portions 108 of the die-side bonding structures 109 may be omitted such that a solder-based bonding of the semiconductor IC die 105 to the target substrate 201 may be accomplished using a single set of solder material portions (e.g., solder balls).

In some instances, the upper surface 203 of the target substrate 201 and/or the lower surface 114 of the semiconductor IC die 105 may not be parallel to the tool plane TP defined by the lower surface 103 of the nozzle plate 102 of the bond head 101. This may be due to variations in the thickness and/or the surface planarity of either the target substrate 201, the semiconductor IC die 105, or both. As shown in FIG. 2A, for instance, the upper surface 203 of the target substrate 201 slopes upward from left to right and is not parallel to the tool plane TP which extends horizontally. In some instances, the variation in vertical elevation of the upper surface 203 of the target substrate 201 over the region in which the semiconductor IC die 105 is to be bonded may be greater than 18 μm. As noted above, such non-uniformities in the interfacing surfaces 203 and 114 of the target substrate 201 and the semiconductor IC die 105 may inhibit effective contact between the respective bonding structures 109 and 209, resulting in poor bonding between the semiconductor IC die 105 and the target substrate 201. Various embodiments may compensate for such surface non-uniformities by utilizing a bond head 101 having a self-tilt capability, as described in further detail below.

Figure 2B:
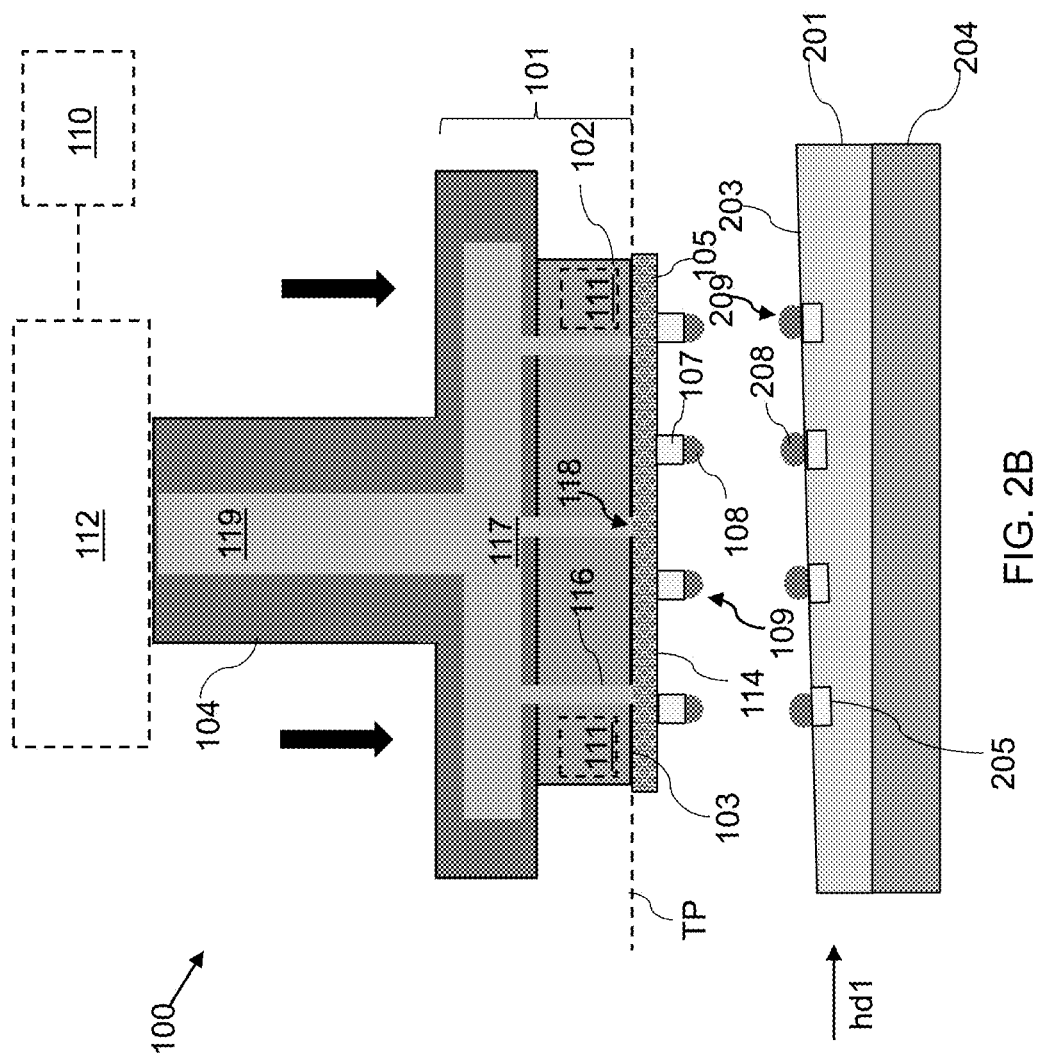
FIG. 2B is a vertical cross-section view of the die bonding tool illustrating the bond head and the semiconductor IC die attached thereto moved vertically downward towards the upper surface of the target substrate according to various embodiments of the present disclosure.

FIG. 2B is a vertical cross-section view of the die bonding tool 100 illustrating the bond head 101 and the semiconductor IC die 105 attached thereto moved vertically downward towards the upper surface 203 of the target substrate 201 according to an embodiment of the present disclosure. In various embodiments, the die bonding tool 100 may perform a "soft contact" process to bring the die-side bonding structures 109 on the lower surface 114 of the semiconductor IC die 105 into contact with the corresponding substrate-side bonding structures 209 on the upper surface 203 of the target substrate 201. The soft contact process may include a step of moving the bond head 101 and the semiconductor IC die 105 vertically downward (as indicated by the arrows in FIG. 2B) until an initial contact is made between one or more die-side bonding structures 109 on the semiconductor IC die 105 and the corresponding substrate-side bonding structures 209 on the target substrate 201.

Figure 2C:
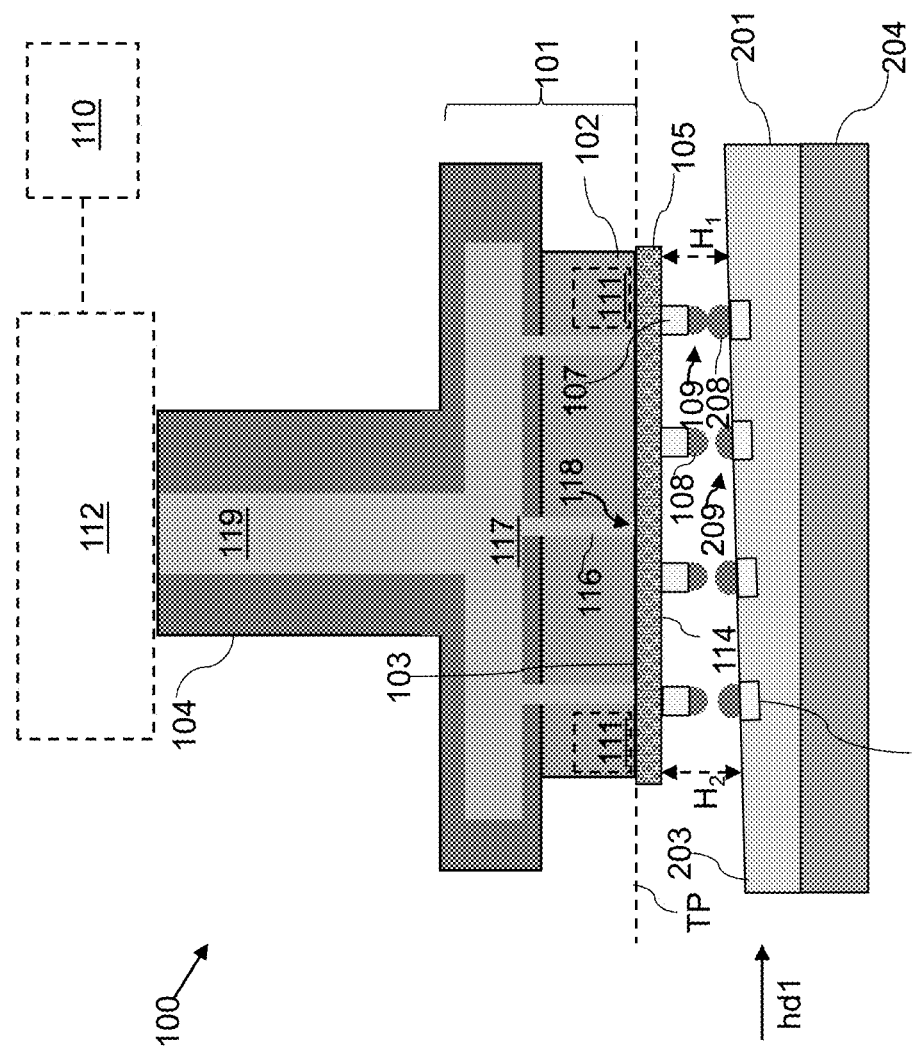
FIG. 2C is a vertical cross-section view of the die bonding tool illustrating an initial contact between a die-side bonding structure on the semiconductor IC die and the corresponding substrate-side bonding structure on the target substrate according to various embodiments of the present disclosure.

FIG. 2C is a vertical cross-section view of the die bonding tool 100 illustrating an initial contact between a die-side bonding structure 109 on the semiconductor IC die 105 and the corresponding substrate-side bonding structure 209 on the target substrate 201 according to an embodiment of the present disclosure. Referring to FIG. 2C, the bond head 101 and the semiconductor IC die 105 attached thereto may continue to move vertically downward towards the upper surface 203 of the target substrate 201 until the system controller 110 determines that an initial contact has been made between one or more die-side bonding structures 109 on the semiconductor IC die 105 and the corresponding substrate-side bonding structure(s) 209 on the target substrate 201. The system controller 110 may determine that an initial contact has been made based on feedback signals received from the at least one contact sensor 111 of the die bonding tool 100.

The system controller 110 may also determine the region of the semiconductor IC die 105 that made the initial contact with the target substrate 201 based on the signal feedback from the at least one contact sensor 111. In one non-limiting embodiment, the at least one contact sensor 111 may include a plurality of force sensors located in different regions of the bond head 101. As the initial contact is made between one or more die-side bonding structures 109 on the semiconductor IC die 105 and the corresponding substrate-side bonding structure(s) 209 on the target substrate 201, the resulting force of the contact may be transmitted from the die-side bonding structure(s) 109 through the semiconductor IC die 105 to the bond head 101, where the force may be detected by a force sensor located in a region of the bond head 101 that overlies or is in nearest proximity to the location of the initial contact between the semiconductor IC die 105 and the target substrate 201. In the exemplary embodiment shown in FIG. 2C, for example, the initial contact between a die-side bonding structure 109 and the corresponding substrate-side bonding structure 209 occurs on the right-hand side of the semiconductor IC die 105. Thus, the force resulting from this initial contact may be detected by the contact sensor 111 located on the right hand side of bond head 101, which may transmit force feedback signals to the system controller 110. Based on the force feedback signals, the system controller 110 may determine that at least one die-side bonding structure 109 on the right-hand side of the semiconductor IC die 105 is in contact with the corresponding substrate-side bonding structures 209. Other die-side bonding structures 109 of the semiconductor IC die 105 may not be in contact with the corresponding substrate-side bonding structures 209 on the target substrate 201.

In embodiments in which the at least one contact sensor 111 comprises one or more encoders, the system controller 110 may determine that an initial contact has been made based on a change in encoder feedback signals. The change in encoder feedback signals may be due to an increase in resistance to further downward movement by the bond head 101 resulting from the initial contact between at least one die-side bonding structure 109 and substrate-side bonding structure 209 pair. The system controller 110 may determine the location of the initial contact based on differences in encoder feedback signals measuring the position and/or motion of different regions of the bond head 101.

Referring again to FIG. 2C, because the upper surface 203 of the target substrate 201 is not parallel to the tool plane TP, there is a variation in the gap height, H, between the lower surface 114 of the semiconductor IC die 105 and the upper surface 203 of the target substrate 201. In this example, the maximum height gap, $H_2$, is located proximate to the left-hand side of the semiconductor IC die 105 while the minimum height gap, $H_1$, is located proximate to the right-hand side of the semiconductor IC die 105. In some embodiments, a difference between the maximum height gap (e.g., $H_2$) and the minimum height gap (e.g., $H_1$) over the semiconductor IC die 105 upon the initial contact with the target substrate 201 may be greater than 15 µm, such as greater than 20 µm (e.g., ≥ 30 µm), including greater than 50 µm. Such variations in gap height may result in joint height differences in different regions of the semiconductor IC die 105 following the bonding of the semiconductor IC die 105 to the target substrate 201. Large variations in joint heights may result in poor or defective connections between semiconductor IC die 105 and the target substrate 201. Thus, it is generally desirable to minimize the total joint height difference (i.e., the difference between the maximum joint height and the minimum joint height of all of the bonds formed between the semiconductor IC die 105 and the target substrate 201) in the bonded device structure.

Figure 2D:
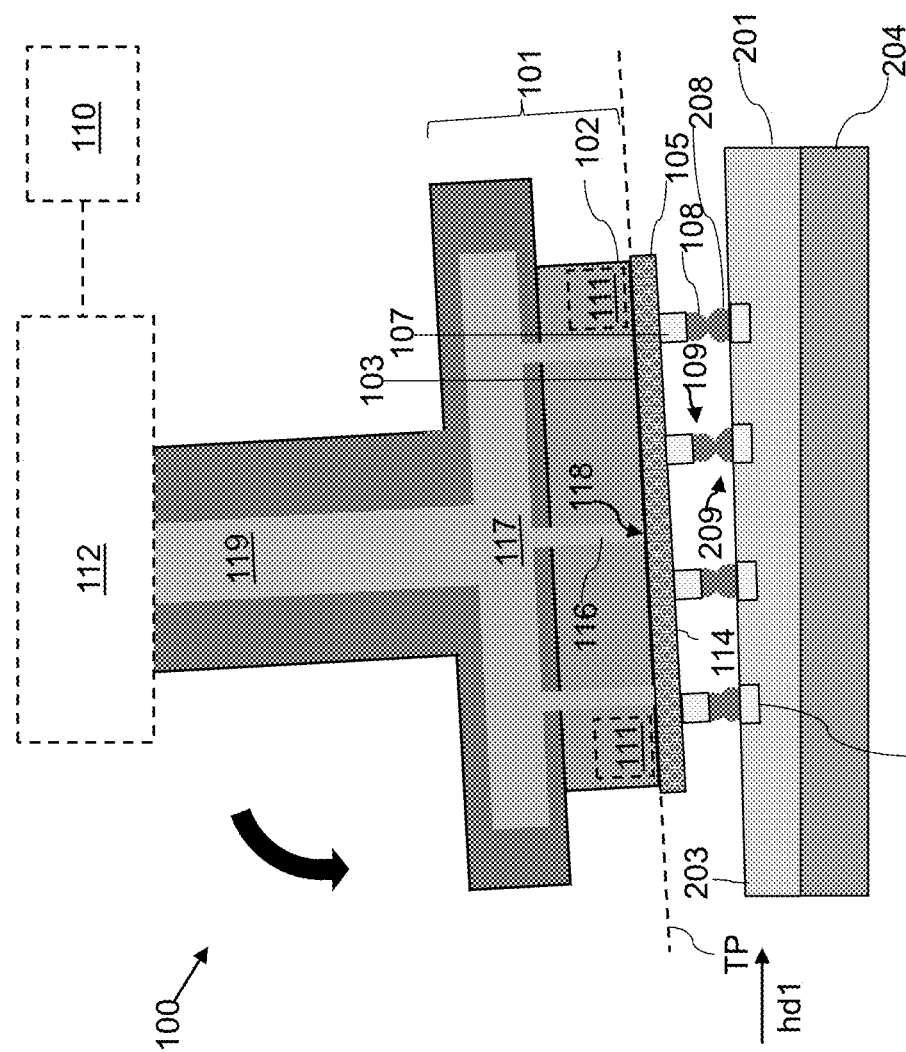
FIG. 2D is a vertical cross-section view of the die bonding tool illustrating the bond head and the semiconductor IC die attached thereto tilted to bring additional die-side bonding structure on the semiconductor IC die into contact with the corresponding substrate-side bonding structures on the target substrate according to various embodiments of the present disclosure.

FIG. 2D is a vertical cross-section view of the die bonding tool 100 illustrating the bond head 101 and the semiconductor IC die 105 attached thereto tilted to bring additional die-side bonding structure 109 on the semiconductor IC die 105 into contact with the corresponding substrate-side bonding structures 209 on the target substrate 201 according to an embodiment of the present disclosure. Referring to FIG. 2D, following the initial contact between the semiconductor IC die 105 and the target substrate 201, the soft contact process may include a step of tilting the bond head 101 and the semiconductor IC die 105 attached thereto with respect to the target substrate 201 to bring additional die-side bonding structures 109 into contact with the corresponding substrate-side bonding structures 209. In some embodiments, the tilt motion of the bond head 101 may bring all of the die-side bonding structures 109 of the semiconductor IC die 105 into contact with the corresponding substrate-side bonding structures 209 of the target substrate 201. This may provide improved contact between the semiconductor IC die 105 and the target substrate 201 and result in more effective bonding between these components.

Referring again to FIG. 2D, the system controller 110 may control the actuator system 112 to cause the bond head 101 to tilt about at least one tilt axis (e.g., axis $a_1$ and/or axis $a_2$ in FIG. 1B) to bring additional die-side bonding structures 109 into contact with the corresponding substrate-side bonding structures 209. In this regard, the system controller 110 may control the actuator system 112 to cause the TP of the bond head 101 to match the angle of the top surface 203 of the target substrate 201. In an embodiment bond head 101 having contact sensors 111 configured to detect contact in four corner regions of the bond head 101 such as shown in FIG. 1B, when the initial contact with the target substrate 201 is detected in a particular corner region of the bond head 101, the system controller 110 may control the actuator system 112 to tilt the bond head 101 such that the other three corner regions of the bond head 101 are moved downwards towards the target substrate 201. In embodiments in which the initial contact with the target substrate 201 is detected in two corner regions of the bond head 101, the system controller 110 may control the actuator system 112 to tilt the bond head such that the other two corner regions of the bond head 101 are moved downwards towards the target substrate 201. In some embodiments, the tilt motion of the bond head 101 may be accompanied by a small vertical downward movement of the bond head 101 to maintain adequate contact between the die-side bonding structure 109 and the substrate-side bonding structures 209 in regions of the semiconductor IC die 105 that are already in contact with the target substrate 201.

In some embodiments, the tilt motion of the bond head 101 may continue until a contact criterion is met. The contact criterion may include, for example, a number of contact sensors 111 in different regions of the bond head 101 that detect contact between the underlying die-side bonding structures 109 and the corresponding substrate-side bonding structures 209 (e.g., a percentage of contact sensors 111 that detect contact, such as all contact sensors 111 of the bond head 101), and/or an amount of contact detected between the die-side bonding structures 109 and the corresponding substrate-side bonding structures 209 (e.g., the magnitude of contact force detected by all or a portion of the contact sensors 111 on the bond head 101 exceeds a threshold value). The system controller 110 may control the actuator system 112 to stop the tilt motion of the bond head 101 based on a determination that the contact criterion is met.

FIG. 2E is a vertical cross-section view of the die bonding tool 100 following a bonding process that bonds the semiconductor IC die 105 to the target substrate 201 to form a bonded device structure 250 according to an embodiment of the present disclosure. Referring to FIG. 2E, when the die-side bonding structures 109 on the semiconductor IC die 105 are brought into contact with the substrate-side bonding structures 209 on the target substrate 201, a bonding process may be performed to bond the semiconductor IC die 105 to the target substrate 201. FIGS. 2A-2E illustrate a solder-based bonding method that includes the formation of solder bonds 211 between the lower surface 114 of the semiconductor IC die 105 and the upper surface 203 of the target substrate 201. Each of the solder bonds 211 may include a solder connection 210 located between a metal pillar 107 on the semiconductor IC die 105 and a bonding pad 205 on the target substrate 201. The solder bonds 211 may be formed via a reflow process that includes the application of heat and/or pressure to cause the solder material portions 108 and 208 to reflow and solidify to form the solder bonds 211 which provide a mechanical and electrical connection between respective metal pillar 107 and bonding pad 205 pairs. In some embodiments, the bond head 101 may apply a compressive force to the upper surface of the semiconductor IC die 105 during the bonding process. The compressive force may be between about 2.5 N and about 10 N. The compression force may be in a direction that is normal to the lower surface 103 of the nozzle plate 102 (i.e., perpendicular to the tool plane TP). The tool plane TP may be tilted with respect to its initial orientation (e.g., a horizontal orientation as shown in FIG. 2A). In some embodiments, the semiconductor IC die 105 and the target substrate 201 may be subjected to an elevated temperature, such as a temperature between about 150° C. and about 350° C., during the bonding process. In some embodiments, the elevated temperature may be provided by a heating mechanism (not shown) located on the die bonding tool 100, such as on or within the bond head 101 and/or the lower support member 204.

In various embodiments, the die bonding tool 100 may release the semiconductor IC die 105 from the lower surface 103 of the nozzle plate 102 either prior to, during, or following the bonding process. The die bonding tool 100 may release the semiconductor die 105 from the lower surface 103 of the nozzle plate by turning off/disconnecting the vacuum source and/or by providing an ambient or positive pressure within the fluid conduit 119, the plenum 117 and the fluid conduits 116, thereby releasing the suction force at the openings 118 in the nozzle plate 102. Following the release of the semiconductor IC die 105 from the lower surface 103 of the nozzle plate 102, the system controller 110 may cause the actuator system 112 to move the bond head 101 vertically upwards and away from the semiconductor IC die 105.

Referring again to FIG. 2E, the bonded device structure 250 includes a plurality of solder bonds 211 that mechanically and electrically couple the semiconductor IC die 105 to a substrate 201. In some embodiments, the center-to-center spacing (i.e., pitch) between each of the solder bonds 211 may be about 150 µm or less. Each of the solder bonds 211 may have a joint height (JH) between the upper surface 203 of the target substrate 201 and the lower surface 114 of the semiconductor IC die 105. In various embodiments, a difference between a maximum joint height JH and a minimum joint height JH across all of the solder bonds 211 of the bonded device structure 250 may be 15 µm or less. Accordingly, the joint heights JH of the solder bonds 211 may be relatively uniform which may provide for a more effective bonding between the semiconductor IC die 105 and the target substrate 201.

FIGS. 3A-3E are sequential vertical cross-section views illustrating an alternative process of bonding a semiconductor IC die 105 to a target substrate 201 using a die bonding tool 100 according to various embodiments of the present disclosure. The bonding process shown in FIGS. 3A-3E may be similar to the bonding process described above with reference to FIGS. 2A-2E. Thus, repeated discussion of common structures and operations of the die bonding tool 100, the semiconductor IC die 105 and the target substrate 201 are omitted for brevity. The bonding process of FIGS. 3A-3E differs from the bonding process of FIGS. 2A-2E in that a different bonding mechanism is utilized to bond the semiconductor IC die 105 to the target substrate 201. In the embodiment of FIGS. 3A-3E, the die-side bonding structures 109 located over the lower surface 114 of the semiconductor IC die 105 and the substrate-side bonding structures 209 located over the upper surface 203 of the target substrate 201 may each include metal connectors 301, 303 (e.g., metal bonding pads, bumps, pillars, studs, etc.) that may be bonded together using a direct bonding process that does not require the use of solder material portions 108, 208 (e.g. solder balls) located between the respective metal connectors 301 and 303.

Figure 3A:
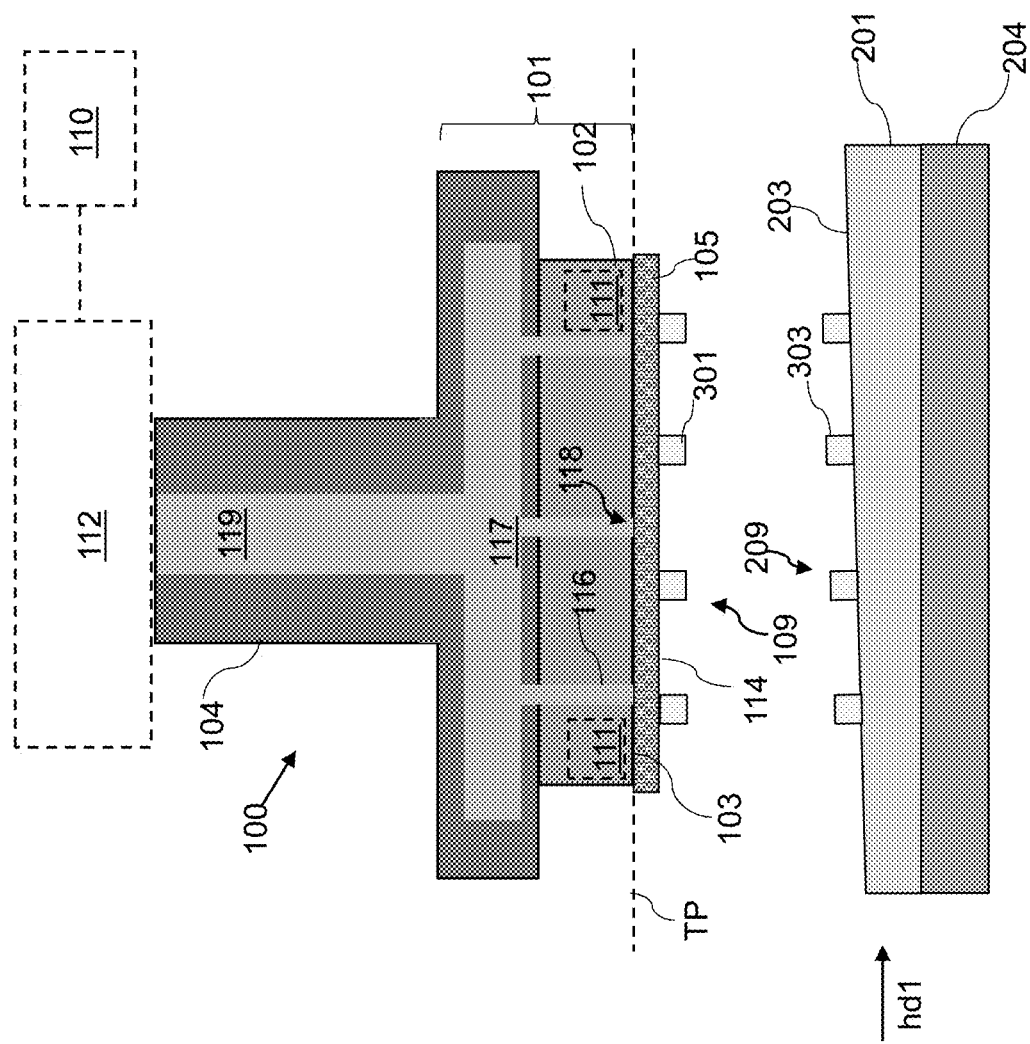
FIG. 3A is a vertical cross-section view of a die bonding tool illustrating a semiconductor integrated circuit (IC) die attached to a bond head of the die bonding tool and aligned over a target substrate according to another embodiment of the present disclosure.

Referring to FIG. 3A, a semiconductor IC die 105 is shown secured against the lower surface 103 of the nozzle plate 102 of the bond head 101 via a vacuum or suction force applied at the one or more openings 118 in the lower surface 103 of the nozzle plate 102. The semiconductor IC die 105 includes a plurality of die-side bonding structures 109 located over the lower surface 114 of the semiconductor IC die 105 opposite to the bond head 101. In the embodiment shown in FIGS. 3A-3E, the die-side bonding structures 109 include a plurality of first metal connectors 301 (e.g., bonding pads, pillars, studs, bumps, etc.) on the lower surface 114 of the semiconductor IC die 105. In some embodiments, the first metal connectors 301 may include copper or a copper alloy. Other suitable conductive materials for the first metal connectors 301, including nickel, platinum, palladium, gold, aluminum, etc., including combinations and alloys thereof, may be utilized. The first metal connectors 301 may be formed using a suitable technique as described above. In some embodiments, a center-to-center spacing (i.e., pitch) between the die-side bonding structures 109 on the lower surface 114 of the semiconductor IC die 105 utilizing a direct bonding method may about 25 µm or less.

The target substrate 201 may have a plurality of substrate-side bonding structures 209 located over the upper surface 203 of the target substrate 201. In the embodiment shown in FIGS. 3A-3E, the substrate-side bonding structures 209 include a plurality of second metal connectors 303 (e.g., bonding pads, pillars, studs, bumps, etc.) on the upper surface 203 of the target substrate 201. In some embodiments, the second metal connectors 303 may include copper or a copper alloy. Other suitable conductive materials for the second metal connectors 303, including nickel, platinum, palladium, gold, aluminum, etc., including combinations and alloys thereof, may be utilized. The second metal connectors 303 may be formed using a suitable technique as described above. In some embodiments, the second metal connectors 303 on the target substrate 201 may have the same size and shape and may be composed of the same material(s) as the first metal connectors 301 on the semiconductor IC die 105. Alternatively, the second metal connectors 303 may have a different size and shape and/or may be composed of different material(s) as the first metal connectors 301 on the semiconductor IC die 105. The arrangement and spacing (i.e., pitch) of the second metal connectors 303 on the target substrate 201 may be the same as the arrangement and spacing of the first metal connectors on the semiconductor IC die 105.

In various embodiments, the die-side bonding structures 109 and the substrate-side bonding structures 209 may be free of solder material. Alternatively, one or both of the die-side bonding structures 109 and the substrate-side bonding structures 209 may include a thin (e.g., ≤3 μm thick) surface layer of solder material over the metal connectors 301, 303. In various embodiments, bonding of the die-side bonding structures 109 and the substrate-side bonding structures 209 may be accomplished using a direct bonding process. In a direct bonding process, pairs of first and second metal connectors 301 and 303 may be bonded together without solder disposed between the two metal connectors 301 and 303. For example, the direct bonding may be a copper-to-copper bonding or a gold-to-gold bonding. The methods for performing direct bonding may include thermocompression bonding (TCB). In a direct bonding process, the first metal connectors 301 of the semiconductor IC die 105 may be aligned with, and placed against, the second metal connectors 303 of the target substrate 201. A compressive force may then be applied to press the semiconductor IC die 105 and the target substrate 201 against one another. During the bonding process, the semiconductor IC die 105 and the target substrate 201 may also be heated. With the applied pressure and optionally the elevated temperature, surface portions of the first metal connectors 301 of the semiconductor IC die 105 and the second metal connectors 303 of the target substrate 201 may inter-diffuse, so that bonds may be formed. In some embodiments, a solder layer with thickness less than 3 μm may be added to each side of the metal connectors 301 and 303 of the semiconductor IC die 105 and the target substrate 201. In the direct bonding, the solder layers may be in contact with one another, and may be bonded with underlying non-flowable portions of the first metal connectors 301 and the second metal connectors 303.

Figure 3B:
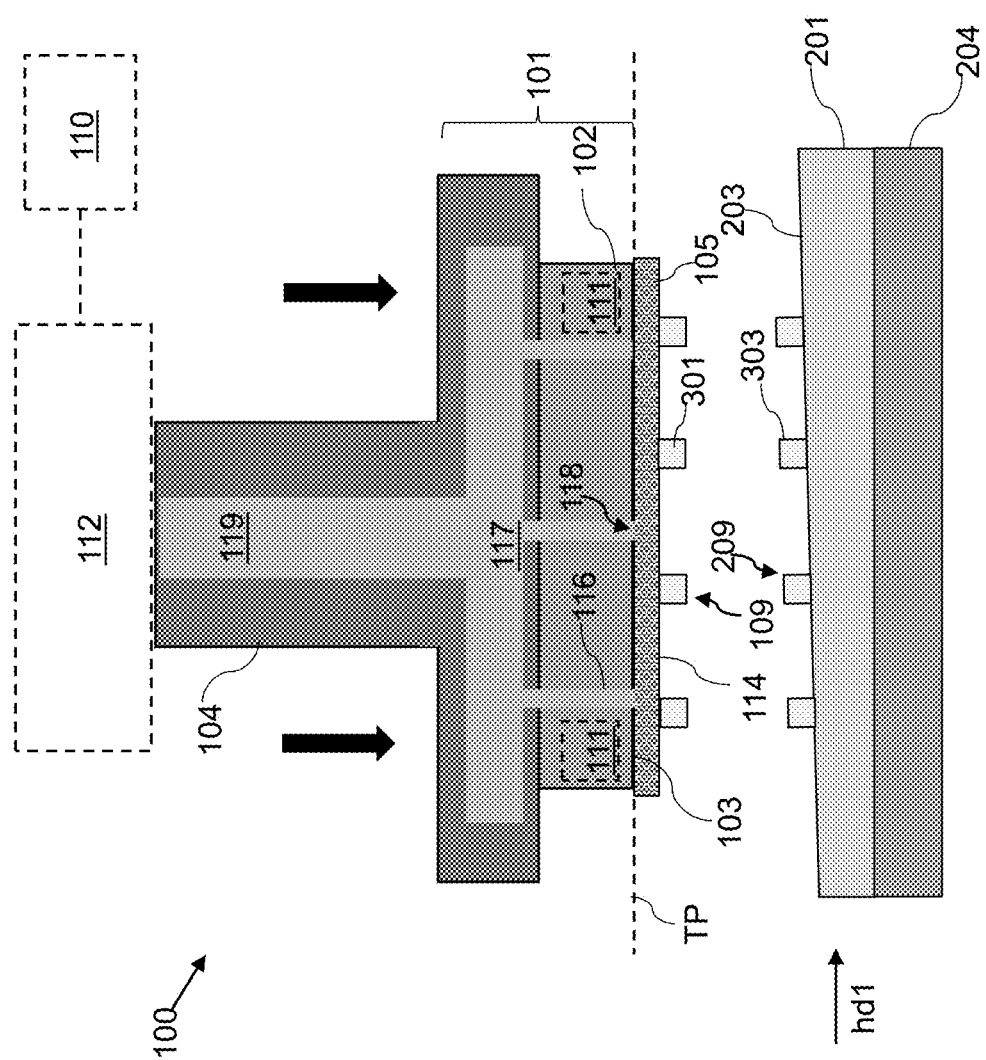
FIG. 3B is a vertical cross-section view of the die bonding tool illustrating the bond head and the semiconductor IC die attached thereto moved vertically downward towards the upper surface of the target substrate according to various embodiments of the present disclosure.

FIG. 3B is a vertical cross-section view of the die bonding tool 100 illustrating the bond head 101 and the semiconductor IC die 105 attached thereto moved vertically downward towards the upper surface 203 of the target substrate 201 according to an embodiment of the present disclosure. As in the embodiment of FIGS. 2A-2E, the die bonding tool 100 may perform a "soft contact" process to bring the die-side bonding structures 109 on the lower surface 114 of the semiconductor IC die 105 into contact with the corresponding substrate-side bonding structures 209 on the upper surface 203 of the target substrate 201. The soft contact process may include a step of moving the bond head 101 and the semiconductor IC die 105 vertically downward (as indicated by the arrows in FIG. 3B) until an initial contact is made between one or more die-side bonding structures 109 on the semiconductor IC die 105 and the corresponding substrate-side bonding structures 209 on the target substrate 201.

Figure 3C:
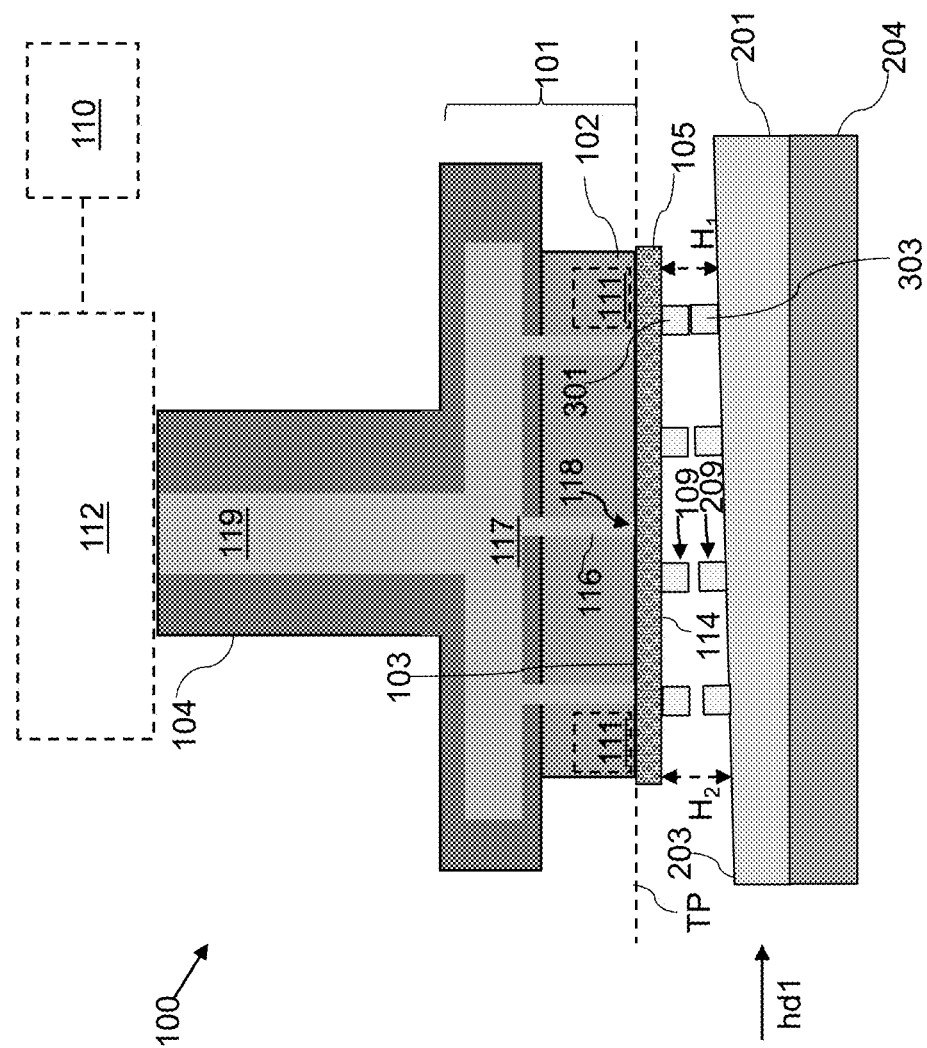
FIG. 3C is a vertical cross-section view of the die bonding tool illustrating an initial contact between a die-side bonding structure on the semiconductor IC die and the corresponding substrate-side bonding structure on the target substrate according to various embodiments of the present disclosure.

FIG. 3C is a vertical cross-section view of the die bonding tool 100 illustrating an initial contact between a die-side bonding structure 109 on the semiconductor IC die 105 and the corresponding substrate-side bonding structure 209 on the target substrate 201 according to an embodiment of the present disclosure. As in the embodiment of FIGS. 2A-2E, the upper surface 203 of the target substrate 201 in the embodiment of FIGS. 3A-3E is not parallel to the tool plane TP defined by the lower surface 103 of the nozzle plate 102 of the bond head 101. In some embodiments, the variation in vertical elevation of the upper surface 203 of the target substrate 201 over the region of the target substrate 201 to which the semiconductor IC die is to be bonded may be greater than 18 μm. Accordingly, an initial contact between one or more die-side bonding structures 109 of the semiconductor IC die 105 and the corresponding substrate-side bonding structures 209 of the target substrate 201 may occur in a particular region of the semiconductor IC die 105 (e.g., the right-hand side of the semiconductor IC die 105 as shown in FIG. 3C), while die-side bonding structures 109 in other regions of the semiconductor IC die 105 may not contact the corresponding substrate-side bonding structures 209 on the target substrate 201. As in the embodiment described above with reference to FIGS. 2A-2E, the system controller 110 of the die bonding tool 100 may determine that an initial contact has been made between the semiconductor IC die 105 and the target substrate 201 and the region of the semiconductor IC die 105 that made the initial contact based on feedback signals received from the at least one contact sensor 111 of the die bonding tool 100.

Referring again to FIG. 3C, when the upper surface 203 of the target substrate 201 is not parallel to the tool plane TP, there may be a variation in the gap height, H, between the lower surface 114 of the semiconductor IC die 105 and the upper surface 203 of the target substrate 201. In this example, the maximum height gap, $H_2$, is located proximate to the left-hand side of the semiconductor IC die 105 while the minimum height gap, $H_1$, is located proximate to the right-hand side of the semiconductor IC die 105. In some embodiments, a difference between the maximum height gap (e.g., $H_2$) and the minimum height gap (e.g., $H_1$) over the semiconductor IC die 105 upon the initial contact with the target substrate 201 may be greater than 15 μm, such as greater than 20 μm (e.g., ≥30 μm), including greater than 50 μm. Such variations in gap height may result in joint height differences in different regions of the semiconductor IC die 105 following the bonding of the semiconductor IC die 105 to the target substrate 201. Large variations in joint heights may result in poor or defective connections between semiconductor IC die 105 and the target substrate 201.

Figure 3D:
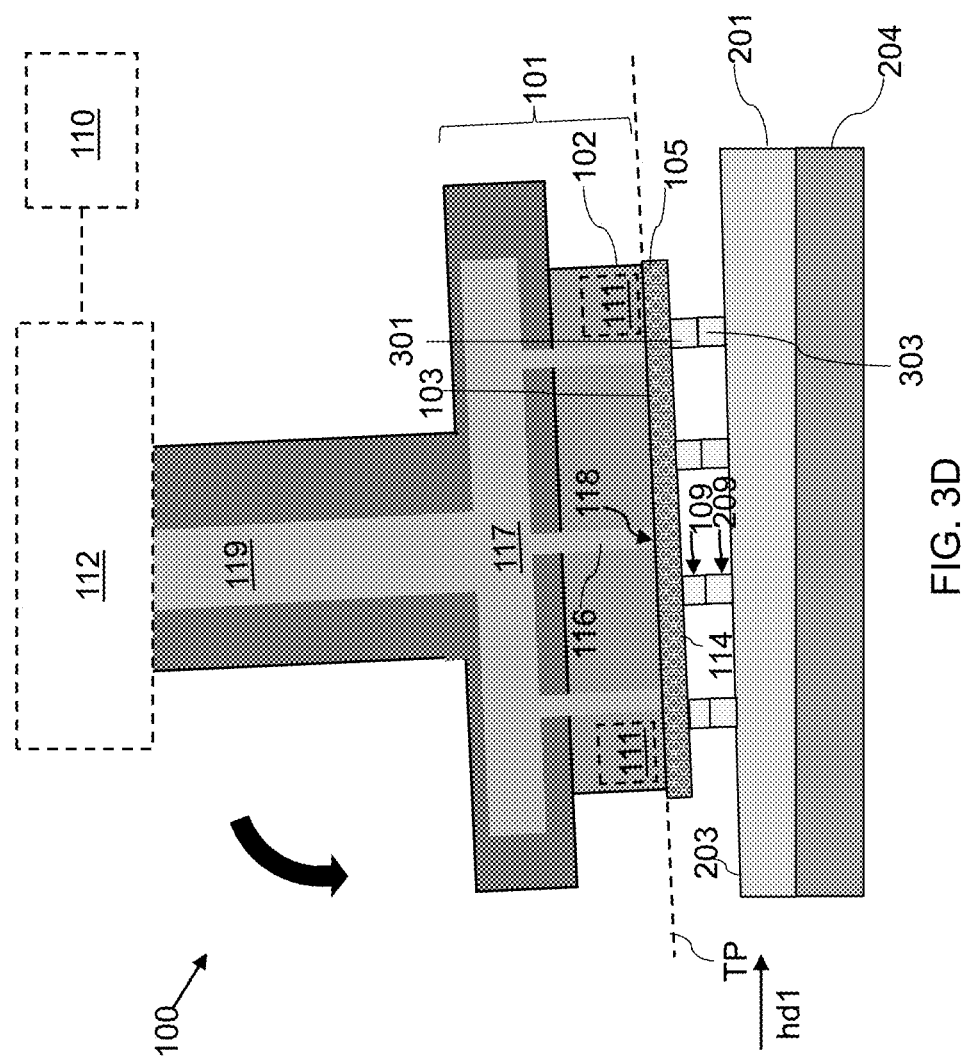
FIG. 3D is a vertical cross-section view of the die bonding tool illustrating the bond head and the semiconductor IC die attached thereto tilted to bring additional die-side bonding structure on the semiconductor IC die into contact with the corresponding substrate-side bonding structures on the target substrate according to various embodiments of the present disclosure.

FIG. 3D is a vertical cross-section view of the die bonding tool 100 illustrating the bond head 101 and the semiconductor IC die 105 attached thereto tilted to bring additional die-side bonding structure 109 on the semiconductor IC die 105 into contact with the corresponding substrate-side bonding structures 209 on the target substrate 201 according to an embodiment of the present disclosure. Referring to FIG. 3D, following the initial contact between the semiconductor IC die 105 and the target substrate 201, the soft contact process may include a step of tilting the bond head 101 and the semiconductor IC die 105 attached thereto with respect to the target substrate 201 to bring additional die-side bonding structures 109 into contact with the corresponding substrate-side bonding structures 209. In some embodiments, the tilt motion of the bond head 101 may bring all of the die-side bonding structures 109 of the semiconductor IC die 105 into contact with the corresponding substrate-side bonding structures 209 of the target substrate 201. This may provide improved contact between the semiconductor IC die 105 and the target substrate 201 and result in more effective bonding between these components.

Referring again to FIG. 3D, the system controller 110 may control the actuator system 112 to cause the bond head 101 to tilt about at least one tilt axis (e.g., axis $a_1$ and/or axis $a_2$ in FIG. 1B) to bring additional die-side bonding structures 109 into contact with the corresponding substrate-side bonding structures 209. In an embodiment bond head 101 having contact sensors 111 configured to detect contact in four corner regions of the bond head 101 such as shown in FIG. 1B, when the initial contact with the target substrate 201 is detected in a particular corner region of the bond head 101, the system controller 110 may control the actuator system 112 to tilt the bond head 101 such that the other three corner regions of the bond head 101 are moved downwards towards the target substrate 201. In embodiments in which the initial contact with the target substrate 201 is detected in two corner regions of the bond head 101, the system controller 110 may control the actuator system 112 to tilt the bond head such that the other two corner regions of the bond head 101 are moved downwards towards the target substrate 201. In some embodiments, the tilt motion of the bond head 101 may be accompanied by a small vertical downward movement of the bond head 101 to maintain adequate contact between the die-side bonding structure 109 and the substrate-side bonding structures 209 in regions of the semiconductor IC die 105 that are already in contact with the target substrate 201.

In some embodiments, the tilt motion of the bond head 101 may continue until a contact criterion is met. The contact criterion may include, for example, a number of contact sensors 111 in different regions of the bond head 101 that detect contact between the underlying die-side bonding structures 109 and the corresponding substrate-side bonding structures 209 (e.g., a percentage of contact sensors 111 that detect contact, such as all contact sensors 111 of the bond head 101), and/or an amount of contact detected between the die-side bonding structures 109 and the corresponding substrate-side bonding structures 209 (e.g., the magnitude of contact force detected by all or a portion of the contact sensors 111 on the bond head 101 exceeds a threshold value). The system controller 110 may control the actuator system 112 to stop the tilt motion of the bond head 101 based on a determination that the contact criterion is met.

Figure 3E:
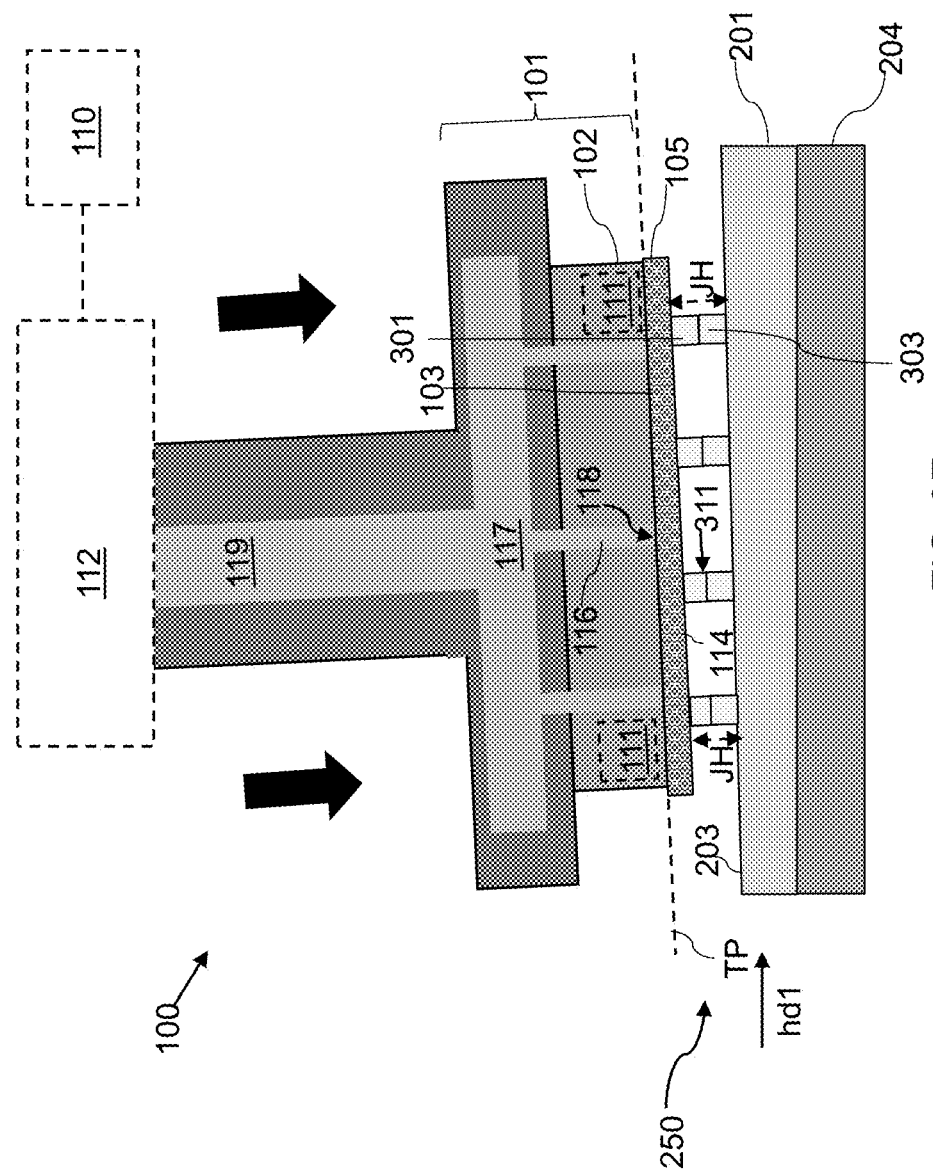
FIG. 3E is a vertical cross-section view of the die bonding tool following a bonding process that bonds the semiconductor IC die to the target substrate to form a bonded device structure according to various embodiments of the present disclosure.

FIG. 3E is a vertical cross-section view of the die bonding tool 100 following a bonding process that bonds the semiconductor IC die 105 to the target substrate 201 to form a bonded device structure 250 according to an embodiment of the present disclosure. Referring to FIG. 3E, when the die-side bonding structures 109 on the semiconductor IC die 105 are brought into contact with the substrate-side bonding structures 209 on the target substrate 201, a bonding process may be performed to bond the semiconductor IC die 105 to the target substrate 201. FIGS. 3A-3E illustrate a direct bonding method that includes the formation of direct bonds 311 between first metal connectors 301 on the semiconductor IC die 105 and the second metal connectors 303 on the target substrate 201. In various embodiments, the bond head 101 may apply a compressive force to the upper surface of the semiconductor IC die 105 during the bonding process, as indicated by the arrows in FIG. 3E. The compressive force may be between about 2.5 N and about 10 N. The compression force may be in a direction that is normal to the lower surface 103 of the nozzle plate 102 (i.e., perpendicular to the tool plane TP). The tool plane TP may be tilted with respect to its initial orientation (e.g., a horizontal orientation as shown in FIG. 3A). In some embodiments, the semiconductor IC die 105 and the target substrate 201 may be subjected to an elevated temperature, such as a temperature between about 150° C. and about 350° C., during the bonding process. In some embodiments, the elevated temperature may be provided by a heating mechanism (not shown) located on the die bonding tool 100, such as on or within the bond head 101 and/or the lower support member 204. In various embodiments, the die bonding tool 100 may release the semiconductor IC die 105 from the lower surface 103 of the nozzle plate 102 either prior to, during, or following the bonding process.

Referring again to FIG. 3E, the bonded device structure 250 includes a plurality of direct bonds 311 that mechanically and electrically couple the semiconductor IC die 105 to a target substrate 201. In some embodiments, the center-to-center spacing (i.e., pitch) between each of the direct bonds 311 may be about 25 μm or less. Each of the direct bonds 311 may have a joint height (JH) between the upper surface 203 of the target substrate 201 and the lower surface 114 of the semiconductor IC die 105. In various embodiments, a difference between a maximum joint height JH and a minimum joint height JH across all of the direct bonds 311 of the bonded device structure 250 may be 15 μm or less. Accordingly, the joint heights JH of the direct bonds 311 may be relatively uniform which may provide for a more effective bonding between the semiconductor IC die 105 and the target substrate 201.

Figure 4:
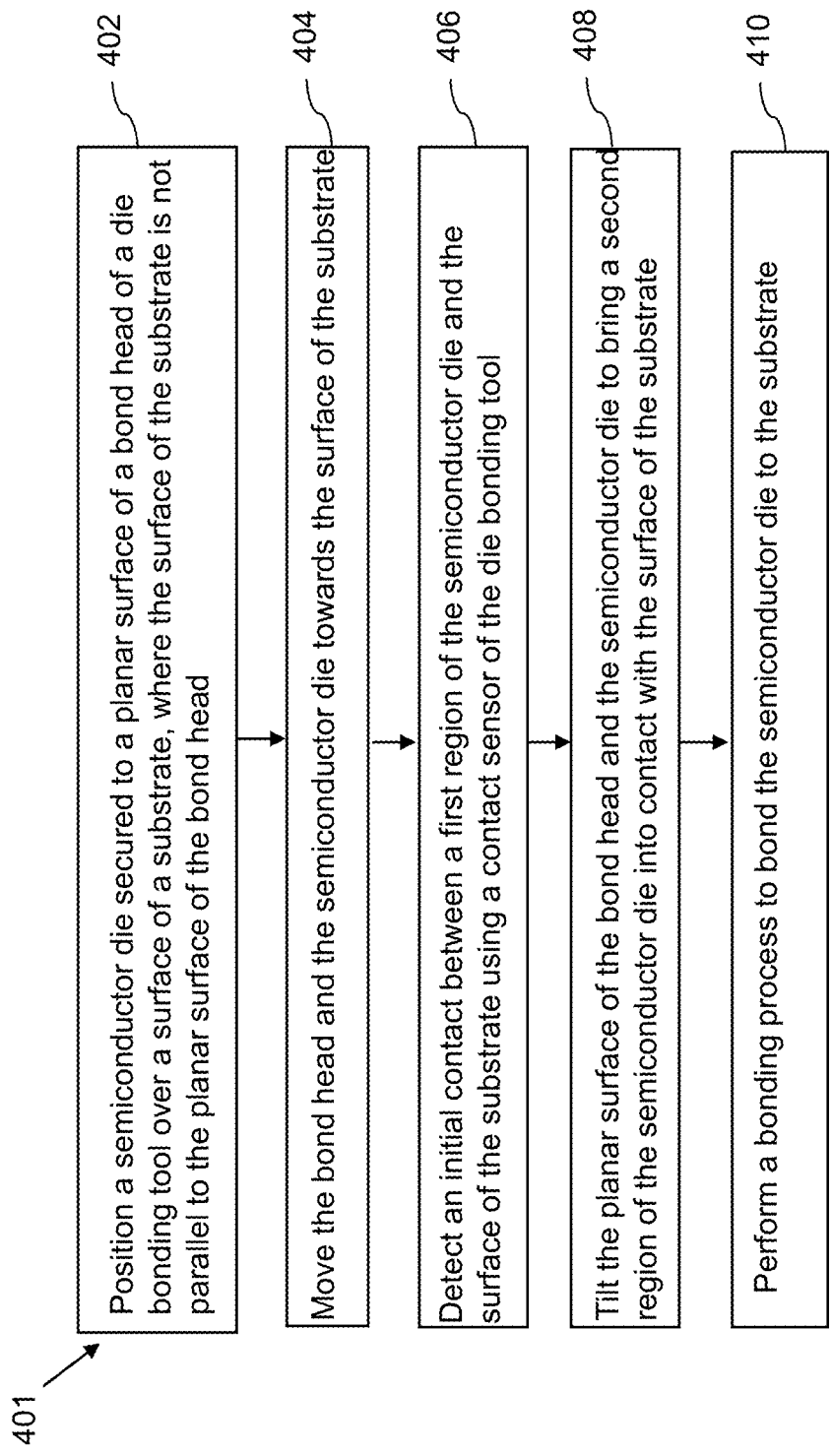
FIG. 4 is a flowchart illustrating a method of bonding a semiconductor die to a target substrate according to an embodiment of the present disclosure.

FIG. 4 is a flowchart illustrating a method 401 of bonding a semiconductor IC die 105 to a target substrate 201 using a die bonding tool 100 according to an embodiment of the present disclosure. Referring to FIGS. 2A, 3A and 4, in step 402 of method 401, a semiconductor die 105 secured to a planar lower surface 103 of a bond head 101 of the die bonding tool 100 may be positioned over a upper surface 203 of a target substrate 201, where the upper surface 203 of the target substrate 201 is not parallel to the planar lower surface 103 of the bond head 101. Referring to FIGS. 2B, 3B and 4, in step 404 of method 401, the bond head 101 and the semiconductor IC die 105 may be moved toward the upper surface 203 of the target substrate 201. Referring to FIGS. 2C, 3C and 4, in step 406 of method 401, an initial contact between the semiconductor IC die 105 and the upper surface 203 of the target substrate 201 may be detected in a first region of the semiconductor IC die 105 using a contact sensor 111 of the die bonding tool 100. Referring to FIGS. 2D, 3D and 4, in step 408 of method 401, the planar lower surface 103 of the bond head 101 and the semiconductor IC die 105 may be tilted to bring a second region of the semiconductor IC die 105 into contact with the upper surface 203 of the target substrate 201. Referring to FIGS. 2E, 3E and 4, in step 410 of method 401, a bonding process may be performed to bond the semiconductor IC die 105 to the upper surface 203 of the target substrate 201.

Referring to all drawings and according to various embodiments of the present disclosure, a die bonding tool 100 includes a bond head 101 configured to secure a semiconductor die 105 temporarily against a planar lower surface 103 of the bond head 101, where the planar lower surface 103 of the bond head 101 is tiltable about a rotation axis ($a_1$, $a_2$), an actuator system 112 configured to move the bond head 101 and a semiconductor die 105 temporarily secured thereto towards a upper surface 203 of a target substrate 201 and to tilt the planar lower surface 103 of the bond head 101 and the semiconductor die 105 with respect to the upper surface of the target substrate 201, and at least one contact sensor 111 configured to detect an initial contact between a first region of the semiconductor die 105 and the upper surface 203 of the target substrate 201, where the actuator system 112 is configured to tilt the planar lower surface 103 of the bond head 101 and the semiconductor die 105 with respect to the upper surface 203 of the target substrate 201 to bring a second region of the semiconductor die 105 into contact with the upper surface 203 of the target substrate 201 in response to the at least one contact sensor 111 detecting the initial contact between the first region of the semiconductor die 105 and the upper surface 203 of the target substrate 201.

In one embodiment, the planar lower surface 103 of the bond head 101 includes a surface of a nozzle plate 102 having at least one opening 118 therein, and the die bonding tool 100 further includes a vacuum source fluidly coupled to the at least one opening 118 in the nozzle plate 102 and configured to selectively generate a suction force at the at least one opening 118 in the nozzle plate 102 to secure a semiconductor die 105 temporarily against the lower surface 103 of the nozzle plate 102.

In another embodiment, the at least one contact sensor 111 includes at least one force sensor.

In another embodiment, the at least one force sensor includes at least one of a strain gauge, a load cell, and a force sensing resistor.

In another embodiment, the at least one force sensor includes a plurality of force sensors configured to detect contact between different regions of the semiconductor die 105 and the upper surface 203 of the target substrate 201.

In another embodiment, the different regions of the semiconductor die 105 include respective corner regions of the semiconductor die 105.

In another embodiment, the first region of the semiconductor die 105 includes a first corner region of the semiconductor die 105, and where the actuator system 112 is configured to tilt the planar lower surface 103 of the bond head 101 and the semiconductor die 105 with respect to the upper surface 203 of the target substrate 201 to bring at least one other region of the semiconductor die 105 into contact with the upper surface 203 of the target substrate 201 in response to the at least one contact sensor 111 detecting the initial contact between the first corner region of the semiconductor die 105 and the upper surface 203 of the target substrate 201.

In another embodiment, the at least one contact sensor 111 includes at least one encoder configured to determine a relative position and/or motion of different regions of the bond head 101.

In another embodiment, the bond head 101 is configured to apply a compressive force on the semiconductor die 105 to bond the semiconductor die 105 to the target substrate 201.

In another embodiment, the compressive force is between 2.5 N and 10 N and is along a direction normal to the tilted planar lower surface 103 of the bond head 101.

Another embodiment is drawn to a die bonding tool including a bond head 101 configured to secure a semiconductor die 105 temporarily against a planar lower surface 103 of the bond head 101, an actuator system 112 configured to move the bond head 101, at least one contact sensor 111 configured to detect contact forces on the bond head 101 in different regions of the bond head 101, and a system controller 110 operatively coupled to the actuator system 112 and to the at least one contact sensor 111, and the system controller 110 is configured to control the actuator system 112 to move the bond head 101 and a semiconductor die 105 secured thereto towards a target substrate 201, and tilt the planar lower surface 103 of the bond head 101 and the semiconductor die 105 about at least one tilt axis ($a_1$, $a_2$) in response to the at least one contact sensor 111 detecting an initial contact between a first region of the semiconductor die 105 and the target substrate 201.

In one embodiment, the system controller 110 is further configured to control the actuator system 112 to stop the tilting of the bond head 101 in response to the system controller 110 determining that a contact criterion between the semiconductor die 105 and the target substrate 201 is met.

In another embodiment, the system controller 110 is further configured to control the actuator system 112 to apply a compressive force on the semiconductor die 105 to bond the semiconductor die 105 to the target substrate 201, where a direction of the compressive force is normal to the planar lower surface 103 of the bond head 101 while the planar lower surface 103 is in a tilted orientation.

Another embodiment is drawn to a method of bonding a semiconductor die 105 to a target substrate 201 that includes positioning a semiconductor die 105 secured to a planar lower surface 103 of a bond head 101 of the die bonding tool 100 over a upper surface 203 of a target substrate 201, where the upper surface 203 of the target substrate 201 is not parallel to the planar lower surface 103 of the bond head 101, moving the bond head 101 and the semiconductor die 105 toward the upper surface 203 of the target substrate 201, detecting an initial contact between the semiconductor die 105 and the upper surface 203 of the target substrate 201 in a first region of the semiconductor die 105 using a contact sensor 111 of the die bonding tool 100, tilting the planar lower surface 103 of the bond head 101 and the semiconductor die 105 to bring a second region of the semiconductor die 105 into contact with the upper surface 203 of the target substrate 201, and performing a bonding process to bond the semiconductor die 105 to the upper surface 203 of the target substrate 201.

In one embodiment, performing the bonding process includes forming a plurality of bonds (211, 311) between die-side bonding structures 109 on the semiconductor die 105 and corresponding substrate-side bonding structures 209 on the substrate 201.

In another embodiment, a difference between a maximum joint height JH and a minimum joint height JH across all of the plurality of bonds (211, 311) is 15 µm or less.

In another embodiment, each of the plurality of bonds include solder bonds 211 having a pitch between each of the solder bonds 211 that is 150 µm or less.

In another embodiment, each of the plurality of bonds include direct bonds 311 having a pitch between each of the direct bonds 311 that is 25 µm or less.

In another embodiment, performing the bonding process includes applying a compressive force on the semiconductor die 105 between 2.5 N and 10 N using the bond head 101, and heating the die-side bonding structures 109 and the substrate-side bonding structures 209 to a temperature between 150° C. and 350° C.

In another embodiment, a variation in vertical elevation of the upper surface 203 of the target substrate 201 over the first region and second region of the target substrate 201 to which the semiconductor die 105 is bonded is greater than 18 µm.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A method of bonding a semiconductor die to a target substrate using a die bonding tool, comprising:
positioning a semiconductor die secured to a planar lower surface of a bond head of the die bonding tool over an upper surface of the target substrate, wherein the upper surface of the target substrate is not parallel to the planar lower surface of the bond head;

moving the bond head and the semiconductor die toward the upper surface of the target substrate;

detecting an initial contact between the semiconductor die and the upper surface of the target substrate in a first region of the semiconductor die using a contact sensor of the die bonding tool;

tilting the planar lower surface of the bond head and the semiconductor die to bring a second region of the semiconductor die into contact with the upper surface of the target substrate; and performing a bonding process to bond the semiconductor die to the upper surface of the target substrate.

2. The method of claim 1, wherein performing the bonding process comprises forming a plurality of bonds between die-side bonding structures on the semiconductor die and corresponding substrate-side bonding structures on the target substrate.

3. The method of claim 2, wherein a difference between a maximum joint height and a minimum joint height across all of the plurality of bonds is 15 μm or less.

4. The method of claim 3, wherein each of the plurality of bonds comprise solder bonds having a pitch between each of the solder bonds that is 150 μm or less.

5. The method of claim 3, wherein each of the plurality of bonds comprise direct bonds having a pitch between each of the direct bonds that is 25 μm or less.

6. The method of claim 2, wherein forming the plurality of bonds comprises:

applying a compressive force on the semiconductor die between 2.5 N and 10 N using the bond head; and heating the die-side bonding structures and the substrate-side bonding structures to a temperature between 150° C. and 350° C.

7. The method of claim 1, wherein a variation in vertical elevation of the upper surface of the target substrate over the first region and the second region of the target substrate to which the semiconductor die is bonded is greater than 18 μm.

8. A method of bonding a semiconductor die to a substrate, comprising:

securing the semiconductor die to a planar surface of a bond head;

moving the bond head and the semiconductor die towards the substrate;

detecting an initial contact between the semiconductor die and the substrate;

tilting the planar surface of the bond head and the semiconductor die about at least one tilt axis in response to detecting the initial contact between the semiconductor die and the target substrate; and stopping the tilting of the planar surface of the bond head and the semiconductor die in response to determining that a contact criterion between the semiconductor die and the target substrate is met.

9. The method of claim 8, further comprising:

applying a compressive force on the semiconductor die along a direction that is perpendicular to the planar surface of the bond head to bond the semiconductor die to the substrate.

10. The method of claim 9, further comprising:

heating the semiconductor die and the substrate while applying the compressive force to bond the semiconductor die to the substrate.

11. The method of claim 8, wherein the contact criterion comprises a predetermined number of contact sensors in different regions of the bond head detecting contact between the semiconductor die and the substrate.

12. The method of claim 8, wherein the contact criterion comprises a magnitude of contact force detected by all or a portion of contact sensors located on the bond head exceeding a threshold value.

13. The method of claim 8, wherein securing the semiconductor die to the planar surface of the bond head comprises controlling a vacuum source to generate a suction force at openings of a nozzle plate that forms the planar surface of the bond head.

14. The method of claim 8, wherein tilting the planar surface of the bond head comprises vertically displacing at least one peripheral edge of the bond head by at least 50 μm.

15. A method of bonding a semiconductor die to a target substrate using a die bonding tool, comprising:

aligning a semiconductor die secured to a lower surface of the die bonding tool over an upper surface of the target substrate such that one or more first bonding features on the semiconductor die are aligned with one or more second bonding features on the target substrate;

controlling the die bonding tool to move semiconductor substrate towards the target substrate;

detecting, at a first contact sensor located in a first region of die bonding tool, contact between one or more first bonding features located in the first region of the semiconductor die and one or more second bonding features on the target substrate;

controlling the die bonding tool to tilt the semiconductor die with respect to the target substrate;

detecting, at a second contact sensor located in a second region of die bonding tool, contact between one or more first bonding features located in a second region of the semiconductor die and one or more second bonding features on the target substrate; and applying a compressive force to the semiconductor die along a direction normal to the lower surface of the die bonding tool in response to detecting the contact between one or more first bonding features located in the second region of the semiconductor die and the one or more second bonding features on the target substrate.

16. The method of claim 15, wherein the first region of the semiconductor die comprises a first corner region of the semiconductor die, and the second region of the semiconductor die comprises a second corner region of the semiconductor die.

17. The method of claim 15, wherein the die bonding tool is controlled to tilt the semiconductor die with respect to the target substrate while moving the semiconductor die towards the target substrate to maintain the contact between the one or more first bonding features located in the first region of the semiconductor die and the one or more second bonding features on the target substrate.

18. The method of claim 15, wherein at least one of the first bonding features and the second bonding features comprise solder material portions.

19. The method of claim 15, wherein the first bonding features are bonded to the second bonding features using thermo-compression bonding.

20. The method of claim 15, wherein at least one of the first contact sensor or the second contact sensor comprises at least one of a strain gauge, a load cell, and a force sensing resistor.

* * * * *